US012770662B2

(12) United States Patent
Chai

(10) Patent No.: US 12,770,662 B2
(45) Date of Patent: Oct. 20, 2026

(54) NONVOLATILE MEMORY DEVICE INCLUDING MULTIPLE PAGE BUFFERS AND OPERATING METHOD THEREOF

(71) Applicant: SK hynix Inc., Gyeonggi-do (KR)

(72) Inventor: Soo Yeol Chai, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 155 days.

(21) Appl. No.: 18/626,349

(22) Filed: Apr. 4, 2024

(65) Prior Publication Data

US 2025/0157507 A1 May 15, 2025

(30) Foreign Application Priority Data

Nov. 13, 2023 (KR) ........................ 10-2023-0156211

(51) Int. Cl.
*G11C 7/10* (2006.01)
*G11C 7/22* (2006.01)

(52) U.S. Cl.
CPC ............ *G11C 7/109* (2013.01); *G11C 7/1039* (2013.01); *G11C 7/1063* (2013.01); *G11C 7/222* (2013.01)

(58) Field of Classification Search
CPC ..... G11C 7/109; G11C 7/1039; G11C 7/1063; G11C 7/222; G11C 7/1045; G11C 7/22; G11C 16/32; G11C 16/10; G11C 16/0483; G11C 16/24
See application file for complete search history.

(56) References Cited

U.S. PATENT DOCUMENTS 9,087,595 B2 7/2015 Lee
2021/0050051 A1* 2/2021 Yang ...................... G11C 16/10
2022/0366993 A1* 11/2022 Kim ..................... G11C 7/1048

FOREIGN PATENT DOCUMENTS

KR 100635205 B1 10/2006
KR 102083450 B1 3/2020

* cited by examiner

*Primary Examiner* — Sultana Begum
(74) *Attorney, Agent, or Firm* — IP&T GROUP LLP

(57) ABSTRACT

A memory device including a memory cell array having multiple memory cells, multiple page buffers connected to the memory cells, and an enable control circuit configured to divide the page buffers into P groups, sequentially enable L groups among the P groups during an entry interval of an operation mode, and adjust a length of the entry interval of the operation mode based on a value of L, wherein P is a natural number greater than or equal to 2, and L is a natural number greater than or equal to 1 and less than or equal to P.

11 Claims, 15 Drawing Sheets

NONVOLATILE MEMORY DEVICE INCLUDING MULTIPLE PAGE BUFFERS AND OPERATING METHOD THEREOF

CROSS-REFERENCE TO RELATED APPLICATION

This application claims priority under 35 U.S.C. § 119 to Korean Patent Application No. 10-2023-0156211 filed on Nov. 13, 2023, which is incorporated herein by reference in its entirety.

BACKGROUND

1. Field

Embodiments of the present disclosure relate to a memory device, and particularly, to a memory device including multiple page buffers and an operating method thereof.

2. Discussion of the Related Art

Memory systems are storage devices embodied using a semiconductor such as silicon (Si), germanium (Ge), gallium arsenide (GaAs), indium phosphide (InP), or the like. The memory systems are classified into a volatile memory device and a nonvolatile memory device. The volatile memory device is a memory device in which data stored therein is lost when power supply is interrupted. Representative examples of the volatile memory device include static RAM (SRAM), dynamic RAM (DRAM), synchronous DRAM (SDRAM), etc. The nonvolatile memory device is a memory device in which data stored therein is retained even when power supply is interrupted. Representative examples of the nonvolatile memory device include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. Flash memories are chiefly classified into a NOR-type memory and NAND-type memory.

The nonvolatile memory device may read or program data through a memory cell array including multiple memory cells that are connected between multiple word lines and multiple bit lines, and multiple page buffers that are connected to the memory cell array through the multiple bit lines.

In this case, the multiple page buffers may each operate as a program driver or a sense amplifier.

For example, after the start of a program operation, the multiple page buffers may each transmit a voltage corresponding to data to be programmed into the multiple bit lines.

Furthermore, after the start of a read operation or a verification operation, the multiple page buffers may each detect data that have been stored in a selected memory cell through the multiple bit lines.

SUMMARY

Various embodiments of the present disclosure are directed to providing a memory device capable of optimizing the time taken for an access operation when data are accessed in a unit smaller than a page, and an operating method thereof.

Technical objects to be achieved by the embodiments of the present disclosure are not limited to the aforementioned object, and the other objects not described above may be evidently understood from the following description by a person having ordinary knowledge in the art to which the present disclosure pertains.

In accordance with an embodiment of the present disclosure, a memory device may include a memory cell array comprising multiple memory cells; multiple page buffers connected to the memory cells; and an enable control circuit configured to divide the page buffers into P groups, sequentially enable L groups among the P groups during an entry interval of an operation mode, and adjust a length of the entry interval of the operation mode based on a value of L, wherein P may be a natural number greater than or equal to 2, and L may be a natural number greater than or equal to 1 and less than or equal to P.

In accordance with an embodiment of the present disclosure, a memory device may include a memory cell array comprising multiple memory cells; multiple page buffers connected to the memory cells; and an enable control circuit configured to divide the page buffers into P groups, sequentially enable the P groups during an entry interval of a first operation mode, and simultaneously enable the P groups during an entry interval of a second operation mode, which is shorter than the entry interval of the first operation mode, wherein P may be a natural number greater than or equal to 2.

In accordance with an embodiment of the present disclosure, an operating method of a memory device comprising multiple page buffers that are connected to multiple memory cells, the operating method may include dividing the page buffers into P groups; sequentially enabling L groups among the P groups during an entry interval of an operation mode; and adjusting a length of the entry interval of the operation mode based on a value of L, wherein P may be a natural number greater than or equal to 2, and L may be a natural number greater than or equal to 1 and less than or equal to P.

In accordance with an embodiment of the present disclosure, an operating method of a memory device comprising multiple page buffers that are connected to multiple memory cells, the operating method may include dividing the page buffers into P groups; sequentially enabling the P groups during an entry interval of a first operation mode; and simultaneously enabling the P groups during an entry interval of a second operation mode which is shorter than the entry interval of the first operation mode, wherein P may be a natural number greater than or equal to 2.

The present technology can adjust the time taken for access based on the number of page buffers that are enabled when only some of multiple page buffers are enabled and used in order to access data in a unit smaller than a page.

Accordingly, the time taken for access when only some of the multiple page buffers are enabled and used in order to access data in a unit smaller than a page can be optimized.

DETAILED DESCRIPTION

Figure 1:
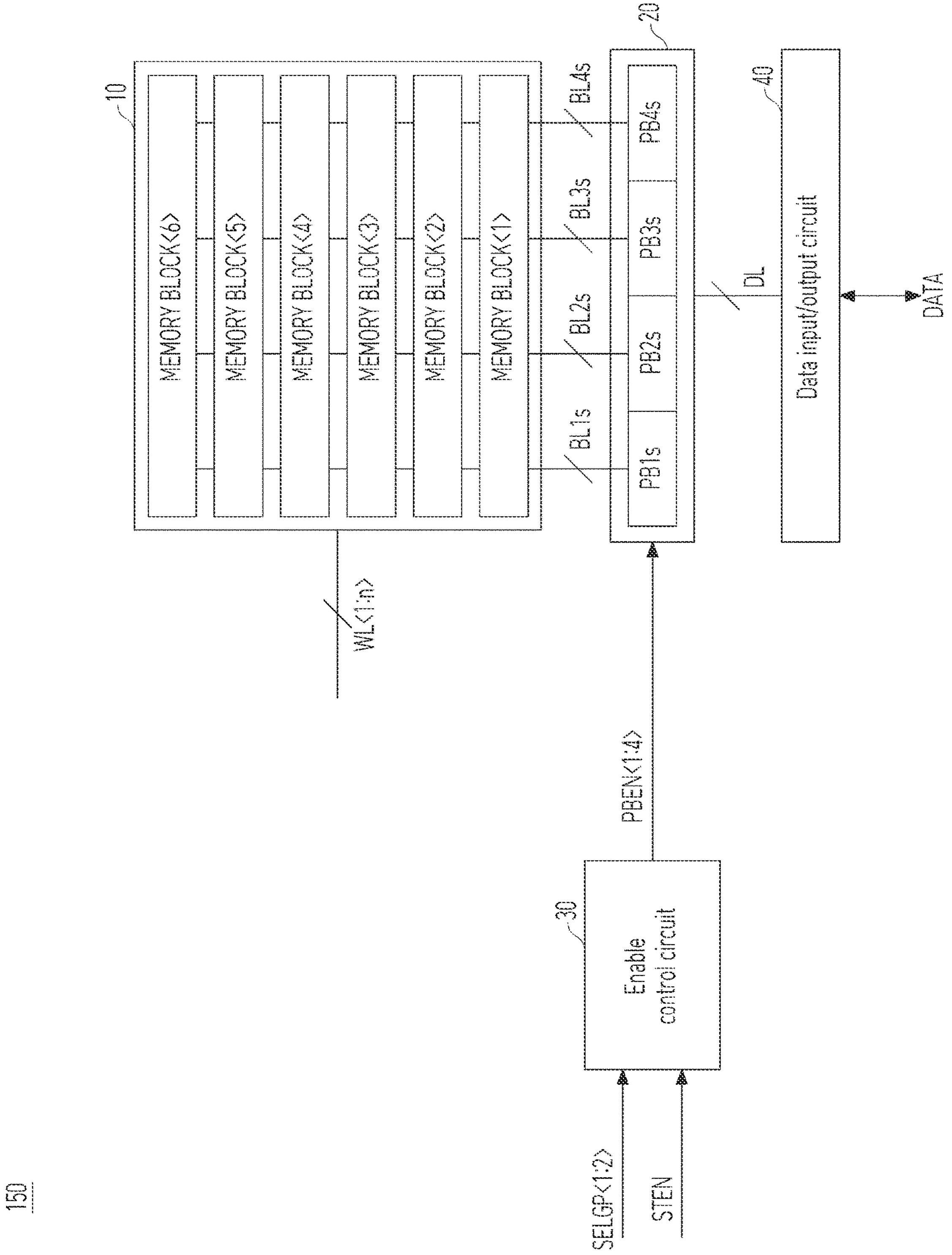
FIG. 1 is a diagram for describing an enable operation of page buffers in a memory device according to an embodiment of the present disclosure.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language includes hardware—for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that implement or perform one or more tasks.

As used in this disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that the terms precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. For example, the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

FIG. 1 is a diagram for describing an enable operation of page buffers in a memory device 150 according to an embodiment of the present disclosure.

Referring to FIG. 1, the memory device 150 according to an embodiment of the present disclosure may include a memory cell array 10, multiple page buffers 20, an enable control circuit 30, and a data input and output (input/output) circuit 40.

The memory cell array 10 may include a plurality of memory blocks, e.g., MEMORY BLOCK<1:6>. Each of the memory blocks MEMORY BLOCK<1:6> may include a plurality of memory cells. One memory block may include a plurality of pages.

The memory blocks may be understood as a group of non-volatile memory cells from which data are removed together through the erase operation. Each of the memory blocks may include a page in which the non-volatile memory cells are grouped, from a logical point of view, such as storing of data together during the program operation or outputting of data together during the read operation. For example, one memory block may include a plurality of pages. One page may include a plurality of non-volatile memory cells.

From a physical point of view different from the logical point of view such as the program operation or the read operation, one memory block may include a plurality of word lines. One word line may include a plurality of non-volatile memory cells.

In this case, one word line may correspond to at least one page according to the number of bits that can be stored or expressed in one non-volatile memory cell. For example, when one non-volatile memory cell is a single level cell (SLC) storing one bit of data, one word line may correspond to one page. When one non-volatile memory cell is a double level cell (DLC) storing two bits of data, one word line may correspond to two pages. When one non-volatile memory cell is a triple level cell (TLC) storing three bits of data, one word line may correspond to three pages. When one non-volatile memory cell is a quadruple level cell (QLC) storing four bits of data, one word line may correspond to four pages. In this way, when one non-volatile memory cell is a multiple level cell storing five or more bits of data, one word line may correspond to five or more pages.

The multiple page buffers 20 may be connected to multiple memory cells included in the memory cell array 10 through multiple bit lines BL1s, BL2s, BL3s, and BL4s. According to an embodiment, each of the multiple page buffers 20 may be connected to one or two bit lines.

The multiple page buffers 20 may communicate data DATA with the data input/output circuit 40. After the start of a program, the multiple page buffers 20 may receive the data DATA that will be stored therein through the data input/output circuit 40 and a data line DL. Operations of the page buffers 20 may be controlled in response to a control signal PBSIGNALS that is generated by a control circuit, e.g., a control logic unit 504 of FIG. 12. In particular, the page buffers 20 may be divided into P groups, e.g., 4 groups PB1s, PB2s, PB3s, and PB4s. The P groups PB1s, PB2s, PB3s, and PB4s may be respectively enabled in response to P group enable signals PBEN<1:4>. The group enable signals PBEN<1:4> are generated by an enable control circuit 30, which may be included in the control logic unit 504. In this case, enabling all P group enable signals PBEN<1:4> may mean that all of the multiple page buffers 20 are enabled. Furthermore, enabling all multiple page buffers 20 may mean that data are read from or programmed into the memory cell array 10 in a page unit. For reference, the P group enable signals PBEN<1:4> may be included in the control signal PBSIGNALS that is generated by the control logic unit 504. In this case, P may be a natural number equal to or greater than 2. In the drawings, P is 4.

After the start of a program operation, the multiple page buffers 20 may store the data DATA that are received from the outside (e.g., a memory controller) through the data input/output circuit 40, and may transmit a program permission voltage or a program prohibition voltage to the bit lines BL1s, BL2s, BL3s, and BL4s based on the stored data DATA. For example, the program permission voltage may be a ground voltage VSS. The program prohibition voltage may be a power source voltage VCORE.

After the start of a read operation, the multiple page buffers 20 may sense the data DATA based on a voltage or current of each of the bit lines BL1s, BL2s, BL3s, and BL4s, which is determined based on the threshold voltages of memory cells of a selected page, and may transmit the sensed data DATA to the data input/output circuit 40 through the data lines DL.

After the start of an erase operation, the multiple page buffers 20 may float the bit lines BL1s, BL2s, BL3s, and BL4s or apply the ground voltage VSS to the bit lines BL1s, BL2s, BL3s, and BL4s.

The data input/output circuit 40 may include multiple input and output buffers that receive the data DATA that are input to the multiple input and output buffers. After the start of a program operation, the data input/output circuit 40 may receive, from the outside, the data DATA to be stored.

More specifically, the enable control circuit 30 may divide the page buffers 20 into the P groups PB1s, PB2s, PB3s, and PB4s, and may adjust the time taken to enable each of the P groups PB1s, PB2s, PB3s, and PB4s depending on how the P groups PB1s, PB2s, PB3s, and PB4s are enabled.

In a first embodiment, the enable control circuit 30 may sequentially enable only L groups, among the P groups PB1s, PB2s, PB3s, and PB4s, during an entry interval of an operation mode. In particular, the enable control circuit 30 may adjust the length of the entry interval of the operation mode based on the value of L. In this case, L may be a natural number equal to or greater than 1 and equal to or less than P.

When P is 4 and L is 1, the enable control circuit 30 may enable only one group (PB1s, PB2s, PB3s, or PB4s) of the four groups PB1s, PB2s, PB3s, and PB4s during the entry interval of the operation mode. When only one of the four groups PB1s, PB2s, PB3s, and PB4s is enabled as described above, it may result in the state in which data are accessed by the memory cell array 10 in a ¼ page unit.

When P is 4 and L is 2, the enable control circuit 30 may sequentially enable only two groups (PB1s and PB2s, PB1s and PB3s, PB1s and PB4s, PB2s and PB3s, PB2s and PB4s, or PB3s and PB4s) of the four groups PB1s, PB2s, PB3s, and PB4s during the entry interval of the operation mode. When only two of the four groups PB1s, PB2s, PB3s, and PB4s are enabled as described above, it may result in the state in which data are accessed by the memory cell array 10 in a ½ page unit. In this case, the enable control circuit 30 may set the length of an operation interval corresponding to a case in which L is 2 to be longer than the length of an operation interval corresponding to a case in which L is 1.

When P is 4 and L is 3, the enable control circuit 30 may sequentially enable only three groups (PB1s, PB2s, and PB3s; PB1s, PB3s, and PB4s; or PB2s, PB3s, and PB4s) of the four groups PB1s, PB2s, PB3s, and PB4s during the entry interval of the operation mode. When only three of the four groups PB1s, PB2s, PB3s, and PB4s are enabled as described above, it may result in the state in which data are accessed by the memory cell array 10 in a ¾ page unit. In this case, the enable control circuit 30 may set the length of an operation interval corresponding to a case in which L is 3 to be longer than the length of an operation interval corresponding to a case in which L is 2.

When P is 4 and L is 4, the enable control circuit 30 may set all of the four groups PB1*s*, PB2*s*, PB3*s*, and PB4*s* as the groups PB1*s*, PB2*s*, PB3*s*, and PB4*s* and sequentially enable the groups PB1*s*, PB2*s*, PB3*s*, and PB4*s* during the entry interval of the operation mode. When all of the four groups PB1*s*, PB2*s*, PB3*s*, and PB4*s* are enabled as described above, it may result in the state in which data are accessed by the memory cell array 10 in one page unit. In this case, the enable control circuit 30 may set the length of an operation interval corresponding to a case in which L is 4 to be longer than the length of an operation interval corresponding to a case in which L is 3.

As described above, in the first embodiment, when selecting only L groups, among the P groups PB1*s*, PB2*s*, PB3*s*, and PB4*s*, and sequentially enabling the L groups during the entry interval of the operation mode, the enable control circuit 30 can adjust the time taken to enable each of the L groups based on the size of data that are accessed by adjusting the length of the entry interval of the operation interval based on the size of L. For example, the enable control circuit 30 may control the time taken to access data of one page to be longer than the time taken to access data of a ½ page.

For reference, a detailed embodiment of the enable control circuit 30 in the first embodiment will be described with reference to FIGS. 2 to 7C.

In a second embodiment, the enable control circuit 30 may sequentially enable the P groups PB1*s*, PB2*s*, PB3*s*, and PB4*s* during an entry interval of a first operation mode, and may simultaneously enable the P groups PB1*s*, PB2*s*, PB3*s*, and PB4*s* during an entry interval of a second operation mode, which is shorter than the entry interval of the first operation mode.

When P is 4, the enable control circuit 30 may sequentially enable the four groups PB1*s*, PB2*s*, PB3*s*, and PB4*s* during the entry interval of the first operation mode, and may simultaneously enable the four groups PB1*s*, PB2*s*, PB3*s*, and PB4*s* during the entry interval of the second operation mode. In this case, the length of the entry interval of the second operation mode may be half (½) the length of the entry interval of the first operation mode.

As described above, in the second embodiment, the enable control circuit 30 can adjust the time taken to enable each of the P groups PB1*s*, PB2*s*, PB3*s*, and PB4*s* depending on the type of operation mode by adjusting a method of accessing the P groups PB1*s*, PB2*s*, PB3*s*, and PB4*s* depending on the type of operation mode.

For reference, a detailed embodiment of the enable control circuit 30 in the second embodiment will be described with reference to FIGS. 8 to 11B.

Figure 2:
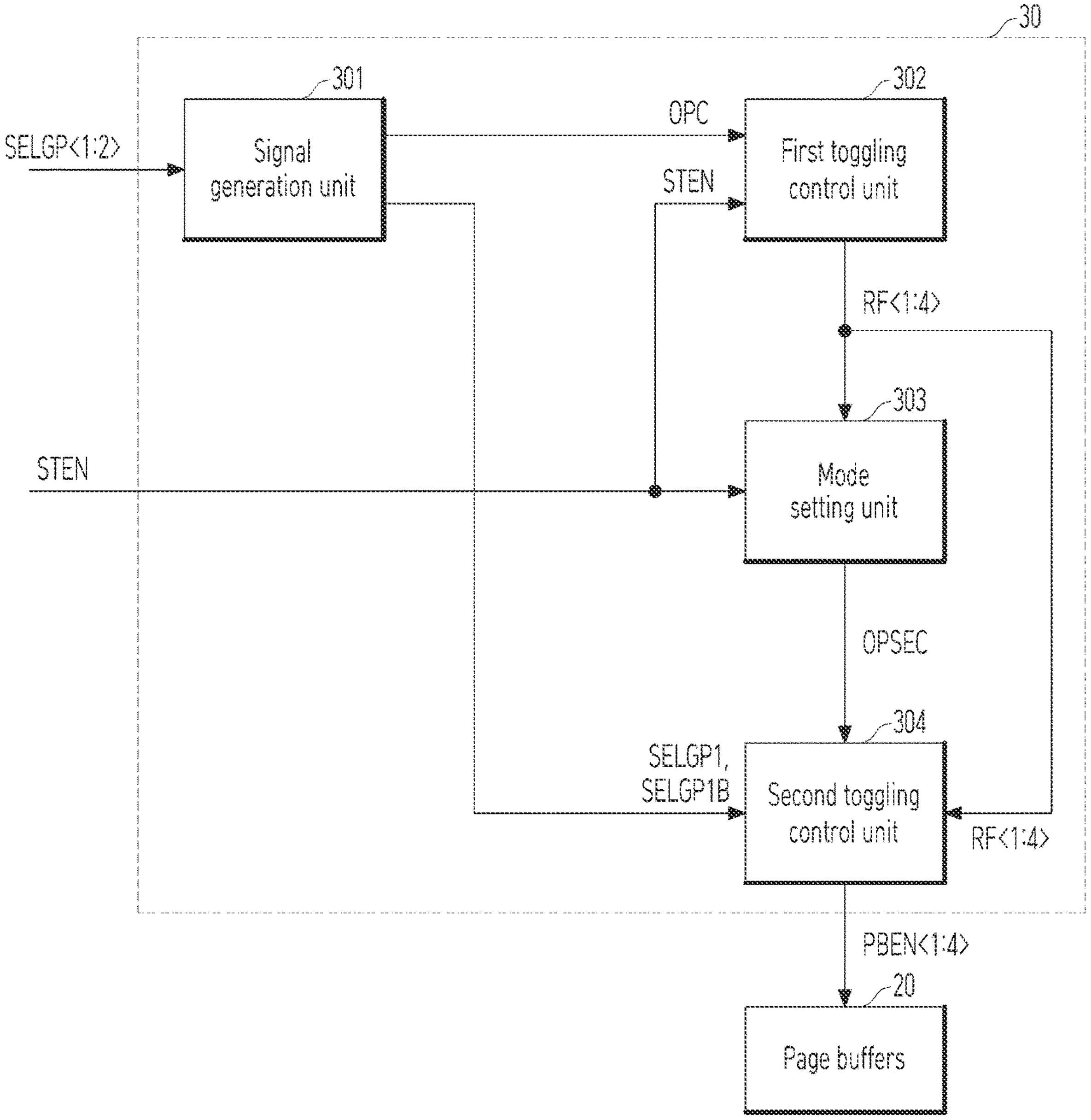
FIG. 2 is a diagram for describing a first embodiment of an enable control circuit, among the components of the memory device disclosed in FIG. 1 according to an embodiment of the present disclosure.

FIG. 2 is a diagram for describing a first embodiment of the enable control circuit 30, among the components of the memory device 150 in FIG. 1 according to an embodiment of the present disclosure.

Referring to FIG. 2, the enable control circuit 30 in the first embodiment, which has been described with reference to FIG. 1, may include a signal generation unit 301, a first toggling control unit 302, a mode setting unit 303, and a second toggling control unit 304.

First, the enable control circuit 30 may divide the page buffers 20 into the P groups PB1*s*, PB2*s*, PB3*s*, and PB4*s*. Furthermore, the enable control circuit 30 may enter the operation mode for accessing the memory cell array 10, may then sequentially enable each of selected L groups, among the P groups PB1*s*, PB2*s*, PB3*s*, and PB4*s*, and may then exit from the operation mode. In this case, all P groups PB1*s*, PB2*s*, PB3*s*, and PB4*s* may be sequentially enabled based on the value of L, and only some of the P groups PB1*s*, PB2*s*, PB3*s*, and PB4*s* may be sequentially enabled because L may be a natural number that is equal to or greater than 1 and equal to or less than P.

According to an embodiment, when P is 4, the enable control circuit 30 may divide the page buffers 20 into four groups PB1*s*, PB2*s*, PB3*s*, and PB4*s*.

In such a state, when L is 1, the enable control circuit 30 may enter the operation mode, may then enable only one (PB1*s*, PB2*s*, PB3*s*, or PB4*s*) of the four groups PB1*s*, PB2*s*, PB3*s*, and PB4*s* during the entry interval of the operation mode, and may then exit from the operation mode at timing at which a group that is enabled for the first time is disabled.

When L is 2, the enable control circuit 30 may enter the operation mode, may then sequentially enable only two (PB1*s* and PB2*s*, PB1*s* and PB3*s*, PB1*s* and PB4*s*, PB2*s* and PB3*s*, PB2*s* and PB4*s*, or PB3*s* and PB4*s*) of the four groups PB1*s*, PB2*s*, PB3*s*, and PB4*s* during the entry interval of the operation mode, and may then exit from the operation mode at a timing at which a group that is enabled for the second time is disabled. In this case, the timing at which the group that is enabled for the second time is disabled, which corresponds to a case in which L is 2, may be a timing later than the timing at which a group that is enabled for the first time is disabled, which corresponds to a case in which L is 1. That is, the length of the entry interval of the operation mode, which corresponds to the case in which L is 2, may be longer than the length of the entry interval of the operation mode, which corresponds to the case in which L is 1.

When L is 3, the enable control circuit 30 may enter the operation mode, may then sequentially enable only three (PB1*s*, PB2*s*, and PB3*s*; PB1*s*, PB3*s*, and PB4*s*; or PB2*s*, PB3*s*, and PB4*s*) of the four groups PB1*s*, PB2*s*, PB3*s*, and PB4*s* during the entry interval of the operation mode, and may then exit from the operation mode at timing at which a group that is enabled for the third time is disabled. In this case, the timing at which the group that is enabled for the third time is disabled, which corresponds to a case in which L is 3, may be a timing later than the timing at which a group that is enabled for the second time is disabled, which corresponds to a case in which L is 2. That is, the length of the entry interval of the operation mode, which corresponds to the case in which L is 3, may be longer than the length of the entry interval of the operation mode, which corresponds to the case in which L is 2.

When L is 4, the enable control circuit 30 may enter the operation mode, may then sequentially enable each of the four groups PB1*s*, PB2*s*, PB3*s*, and PB4*s* during the entry interval of the operation mode, and may then exit from the operation mode at a timing at which a group that is enabled for the fourth time is disabled. In this case, the timing at which the group that is enabled for the fourth time is disabled, which corresponds to a case in which L is 4, may be a timing later than the timing at which a group that is enabled for the third time is disabled, which corresponds to a case in which L is 3. That is, the length of the entry interval of the operation mode, which corresponds to the case in which L is 4, may be longer than the length of the entry interval of the operation mode, which corresponds to the case in which L is 3.

More specifically, the signal generation unit 301 in the enable control circuit 30 may generate a selection control signal OPC for selecting the value of L in response to group selection signals SELGP<1:2>.

According to an embodiment, when P is 4, the signal generation unit 301 may generate the selection control signal OPC for selecting the value of L as one of 1 to 4.

The first toggling control unit 302 in the enable control circuit 30 may sequentially toggle the first to L-th reference signals, among P reference signals RF<1:4>, in response to a start enable signal STEN and the selection control signal OPC.

According to an embodiment, when P is 4 and L is 2, the first toggling control unit 302 may sequentially toggle the first and second reference signals RF<1:2>, in response to the start enable signal STEN. That is, the first toggling control unit 302 may toggle the first reference signal RF1, in response to the start enable signal STEN, may toggle the second reference signal RF2, in response to the toggling of the first reference signal RF1, and might not toggle the third and fourth reference signals RF<3:4>.

According to another embodiment, when P is 4 and L is 3, the first toggling control unit 302 may sequentially toggle the first to third reference signals RF<1:3>, in response to the start enable signal STEN. That is, the first toggling control unit 302 may toggle the first reference signal RF1, in response to the start enable signal STEN, may toggle the second reference signal RF2, in response to the toggling of the first reference signal RF1, may toggle the third reference signal RF3, in response to the toggling of the second reference signal RF2, and might not toggle the fourth reference signal RF4.

The mode setting unit 303 in the enable control circuit 30 may allow the enable control circuit 30 to enter the operation mode in response to the start enable signal STEN, and may allow the enable control circuit 30 to exit from the operation mode in response to the toggling of the L-th reference signal among the L reference signals RF<1:4>.

According to an embodiment, the mode setting unit 303 may allow the enable control circuit 30 to enter the operation mode by activating an operation interval signal OPSEC in response to the start enable signal STEN. Furthermore, the mode setting unit 303 may allow the enable control circuit 30 to exit from the operation mode by deactivating the operation interval signal OPSEC in response to the toggling of the L-th reference signal, among the L reference signals RF<1:4> that are sequentially toggled.

The second toggling control unit 304 in the enable control circuit 30 may select L group enable signals, among the P group enable signals PBEN<1:4>, in response to the group selection signals SELGP<1:2> during the entry interval of the operation mode. That is, the second toggling control unit 304 may select L group enable signals, among the P group enable signals PBEN<1:4>, in response to the group selection signals SELGP<1:2> in an activation interval of the operation interval signal OPSEC. In this case, it may be seen that only the first group selection signal SELGP1 and the inversion signal SELGP1B, among the group selection signals SELGP<1:2>, are directly input to the second toggling control unit 304 illustrated in this drawing. However, as described in the aforementioned operation of the signal generation unit 301, only the first and second reference signals RF<1:2> of the four reference signals RF<1:4> may be sequentially toggled or all of the first to fourth reference signals RF<1:4> may be sequentially toggled based on the logic level of the selection control signal OPC that is generated in response to the first and second group selection signals SELGP<1:2>. Accordingly, both the first and second group selection signals SELGP<1:2> may be considered to be involved in the operation of the second toggling control unit 304.

In this case, each of the P group enable signals PBEN<1:4> may be a signal for enabling each of the P groups PB1*s*, PB2*s*, PB3*s*, and PB4*s*. For example, when a first group enable signal PBEN1, among the P group enable signals PBEN<1:4>, is activated, a first group PB1*s*, among the P groups PB1*s*, PB2*s*, PB3*s*, and PB4*s*, may be enabled. As another example, when a third group enable signal PBEN3, among the P group enable signals PBEN<1:4>, is activated, a third group PB3*s*, among the P groups PB1*s*, PB2*s*, PB3*s*, and PB4*s*, may be enabled.

The second toggling control unit 304 may toggle the selected L group enable signals in response to the first to L-th reference signals, respectively, during the entry interval of the operation mode. That is, the second toggling control unit 304 may toggle the selected L group enable signals in response to the first to L-th reference signals, respectively, in the activation interval of the operation interval signal OPSEC.

According to an embodiment, when P is 4 and L is 2, in response to the group selection signals SELGP<1:2>, the second toggling control unit 304 may select two of the four group enable signals PBEN<1:4>, for example, the first and second group enable signals PBEN<1:2>, the first and third group enable signals PBEN<1, 3>, the first and fourth group enable signals PBEN<1, 4>, the second and third group enable signals PBEN<2:3>, the second and fourth group enable signals PBEN<2,4>, or the third and fourth group enable signals PBEN<3,4>. Furthermore, the second toggling control unit 304 may toggle the two group enable signals PBEN<1,2>, PBEN<1,3>, PBEN<1,4>, PBEN<2,3>, PBEN<2,4>, or PBEN<3,4> that have been selected, in response to the first and second reference signals RF<1:2>, respectively.

According to another embodiment, when P is 4 and L is 3, in response to the group selection signals SELGP<1:2>, the second toggling control unit 304 may select three of the four group enable signals PBEN<1:4>, for example, the first to third group enable signals PBEN<1:3>, the first, third, and fourth group enable signals PBEN<1, 3:4>, or the second to fourth group enable signals PBEN<2:4>. Furthermore, the second toggling control unit 304 may toggle the three group enable signals PBEN<1:3>, PBEN<1, 3:4>, or PBEN<2:4> that have been selected, in response to the first to third reference signals RF<1:3>, respectively.

FIGS. 3 to 6 illustrate detailed circuit constructions of the signal generation unit 301, the first toggling control unit 302, the mode setting unit 303, and the second toggling control unit 304 that are included in the enable control circuit 30 when P is 4 and L is 2 or 4.

That is, in FIGS. 3 to 6, when L is 2, among the four groups PB1*s*, PB2*s*, PB3*s*, and PB4*s*, the first and second groups PB1*s* and PB2*s* are selected as an enable target or the third and fourth groups PB3*s* and PB4*s* are selected as an enable target. Furthermore, when L is 4, all of the four groups PB1*s*, PB2*s*, PB3*s*, and PB4*s* are selected as an enable target.

However, the circuit diagrams disclosed in FIGS. 3 to 6 are merely embodiments and may be reconstructed in different forms depending on a designer's choice.

Figure 3:
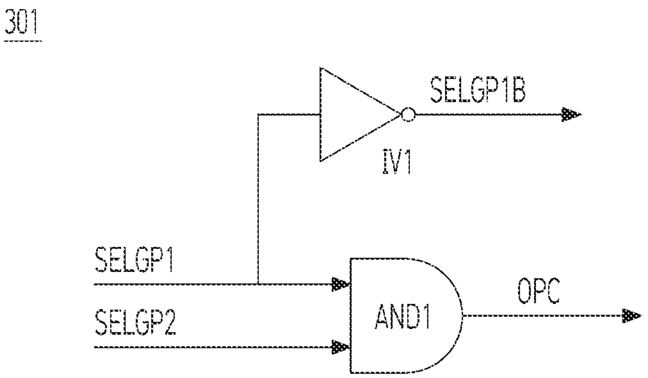
FIG. 3 is a diagram for describing a signal generation unit, among the components of the enable control circuit disclosed in FIG. 2.

FIG. 3 is a diagram for describing the signal generation unit 301, among the components of the enable control circuit 30 disclosed in FIG. 2.

Referring to FIG. 3, the signal generation unit 301 included in the enable control circuit 30 may include an AND gate AND1 and an inverter IV1.

The AND gate AND1 may receive the group selection signals SELGP<1:2> and output the selection control signal OPC.

The inverter IV1 may output an inversion signal SELGP1B by inverting the first group selection signal SELGP1.

According to an embodiment, the first group selection signal SELGP1 may be a signal for selecting, as an enable target, the first and second groups PB1*s* and PB2*s*, among the four groups PB1*s*, PB2*s*, PB3*s*, and PB4*s*.

The second group selection signal SELGP2 may be a signal for selecting, as an enable target, the third and fourth groups PB3*s* and PB4*s*, among the four groups PB1*s*, PB2*s*, PB3*s*, and PB4*s*.

According to an embodiment, when the first group selection signal SELGP1 has a logic high level and the second group selection signal SELGP2 has a logic low level, the AND gate AND1 may output the selection control signal OPC having a logic low level, and the inverter IV1 may output the inversion signal SELGP1B having a logic low level. When the signal generation unit 301 generates the selection control signal OPC having a logic low level, the first group selection signal SELGP1 having a logic high level, and the inversion signal SELGP1B of the first group selection signal SELGP1 having a logic low level as described above, the first and second groups PB1*s* and PB2*s*, among the four groups PB1*s*, PB2*s*, PB3*s*, and PB4*s*, may be selected as an enable target.

According to another embodiment, when the first group selection signal SELGP1 has a logic low level and the second group selection signal SELGP2 has a logic high level, the AND gate AND1 may output the selection control signal OPC having a logic low level, and the inverter IV1 may output the inversion signal SELGP1B having a logic high level. When the signal generation unit 301 generates the selection control signal OPC having a logic low level, the first group selection signal SELGP1 having a logic low level, and the inversion signal SELGP1B of the first group selection signal SELGP1 having a logic high level as described above, the third and fourth groups PB3*s* and PB4*s*, among the four groups PB1*s*, PB2*s*, PB3*s*, and PB4*s*, may be selected as an enable target.

According to still another embodiment, when the first group selection signal SELGP1 has a logic high level and the second group selection signal SELGP2 has a logic high level, the AND gate AND1 may output the selection control signal OPC having a logic high level, and the inverter IV1 may output the inversion signal SELGP1B having a logic low level. When the signal generation unit 301 generates the selection control signal OPC having a logic high level, the first group selection signal SELGP1 having a logic high level, and the inversion signal SELGP1B of the first group selection signal SELGP1 having a logic low level as described above, all of the four groups PB1*s*, PB2*s*, PB3*s*, and PB4*s* may be selected as an enable target.

Figure 4:
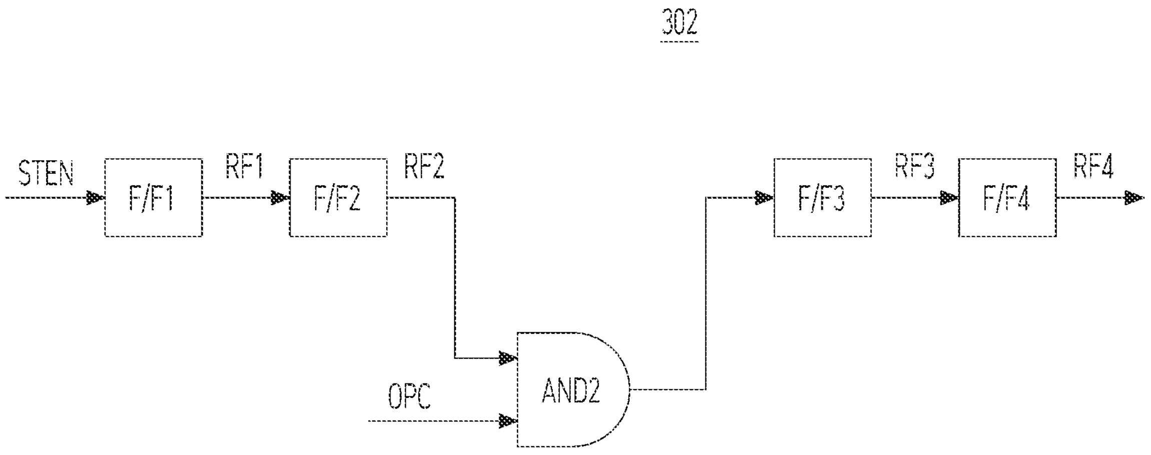
FIG. 4 is a diagram for describing a first toggling control unit, among the components of the enable control circuit disclosed in FIG. 2.

FIG. 4 is a diagram for describing the first toggling control unit 302, among the components of the enable control circuit 30 disclosed in FIG. 2.

Referring to FIG. 4, the first toggling control unit 302 included in the enable control circuit 30 may include P flip-flops, e.g., F/F1, F/F2, F/F3, and F/F4, that are connected in a daisy chain form and an AND gate AND2.

As described in the aforementioned description, the first toggling control unit 302 may select an L-th flip-flop F/F2 or F/F4, among the P flip-flops F/F1, F/F2, F/F3, and F/F4, based on the selection control signal OPC, and may then output L reference signals RF<1:2> or RF<1:4> to output stages of the first to L-th flip-flops F/F1 and F/F2 or F/F1 to F/F4 in response to the start enable signal STEN that is applied to an input stage of the first flip-flop F/F1.

Specifically, each of the P flip-flops F/F1, F/F2, F/F3, and F/F4 included in the first toggling control unit 302 may be a D flip-flop. That is, each of the P flip-flops F/F1, F/F2, F/F3, and F/F4 may output, to its output stage, a signal that is applied to the input stage of each of the P flip-flops F/F1, F/F2, F/F3, and F/F4 by delaying the signal. It may be seen that the four flip-flops F/F1, F/F2, F/F3, and F/F4 have been connected in the daisy chain form in the drawing because P is 4 in the aforementioned description.

The AND gate AND2 included in the first toggling control unit 302 may select the L-th flip-flop F/F2 or F/F4, among the P flip-flops F/F1, F/F2, F/F3, and F/F4, in response to the selection control signal OPC. As described in the aforementioned description, L is 2 or 4. Accordingly, the AND gate AND2 may select whether to transfer a signal that is output from the output stage of the second flip-flop F/F2 to the input stage of the third flip-flop F/F3 in response to the selection control signal OPC. The output stage of the second flip-flop F/F2 is disposed at the second place in the four flip-flops F/F1, F/F2, F/F3, and F/F4. The input stage of the third flip-flop F/F3 is disposed at the third place in the four flip-flops F/F1, F/F2, F/F3, and F/F4.

According to an embodiment, when L is 2, the selection control signal OPC may have a logic low level. Accordingly, the first reference signal RF1 may be output to the output stage of the first flip-flop F/F1 in response to the start enable signal STEN being applied to the input stage of the first flip-flop F/F1 that is disposed at the first place in the four flip-flops F/F1, F/F2, F/F3, and F/F4. The second reference signal RF2 may be output to the output stage of the second flip-flop F/F2 in response to the first reference signal RF1 being applied to the input stage of the second flip-flop F/F2. Thereafter, the second reference signal RF2 might not be transferred to the input stage of the third flip-flop F/F3 through the AND gate AND2. When L is 2, the first toggling control unit 302 may sequentially toggle the first and second reference signals RF<1:2> in response to the start enable signal STEN being toggled.

According to another embodiment, when L is 4, the selection control signal OPC may have a logic high level. Accordingly, the first reference signal RF1 may be output to the output stage of the first flip-flop F/F1 in response to the start enable signal STEN being applied to the input stage of the first flip-flop F/F1 that is disposed at the first place. The second reference signal RF2 may be output to the output stage of the second flip-flop F/F2 in response to the first reference signal RF1 being applied to the input stage of the second flip-flop F/F2. Thereafter, the second reference signal RF2 may be transferred to the input stage of the third flip-flop F/F3 through the AND gate AND2. As described above, the third reference signal RF3 may be output to the output stage of the third flip-flop F/F3 in response to the second reference signal RF2 being applied to the input stage of the third flip-flop F/F3. The fourth reference signal RF4 may be output to the output stage of the fourth flip-flop F/F4 in response to the third reference signal RF3 being applied to the input stage of the fourth flip-flop F/F4. When L is 4, the first toggling control unit 302 may sequentially toggle the first to fourth reference signals RF<1:4> in response to the start enable signal STEN being toggled.

Figure 5:
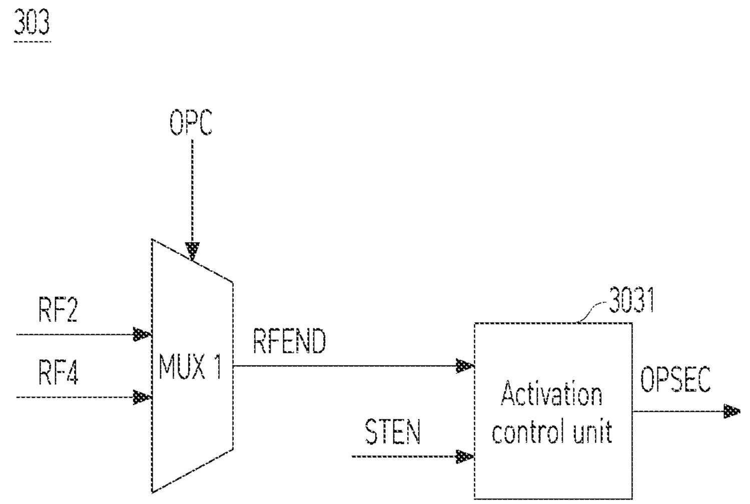
FIG. 5 is a diagram for describing a mode setting unit, among the components of the enable control circuit disclosed in FIG. 2.

FIG. 5 is a diagram for describing the mode setting unit 303, among the components of the enable control circuit 30 disclosed in FIG. 2.

Referring to FIG. 5, the mode setting unit 303 included in the enable control circuit 30 may include a first multiplexer (MUX) MUX1 and an activation control unit 3031.

As described in the aforementioned description, the mode setting unit 303 may allow the enable control circuit 30 to enter the operation mode by activating the operation interval signal OPSEC in response to the start enable signal STEN, and may allow the enable control circuit 30 to exit from the operation mode by deactivating the operation interval signal OPSEC in response to the toggling of the L-th reference signal, among the L reference signals RF<1:4> that are sequentially toggled.

Specifically, the MUX1 included in the mode setting unit 303 may select one of the second reference signal RF2 and the fourth reference signal RF4 and output, as the selected signal RFEND, the selected reference signal in response to the selection control signal OPC. Such an operation of the MUX1 may be performed because L is 2 or 4 in the aforementioned description.

The activation control unit 3031 included in the mode setting unit 303 may activate the operation interval signal OPSEC in response to the start enable signal STEN, and may deactivate the operation interval signal OPSEC in response to the output signal RFEND of the MUX1.

According to an embodiment, when L is 2, the selection control signal OPC may have a logic low level. Accordingly, the signal RFEND that is output by the MUX1 may be the second reference signal RF2. In this case, the activation control unit 3031 may have the state in which the activation control unit 3031 activates the operation interval signal OPSEC in response to the start enable signal STEN and deactivates the operation interval signal OPSEC in response to the second reference signal RF2. That is, the mode setting unit 303 may allow the enable control circuit 30 to enter the operation mode in response to the start enable signal STEN, and may then allow the enable control circuit 30 to exit from the operation mode in response to the second reference signal RF2.

According to another embodiment, when L is 4, the selection control signal OPC may have a logic high level. Accordingly, the signal RFEND that is output by the MUX1 may be the fourth reference signal RF4. In this case, the activation control unit 3031 may have the state in which the activation control unit 3031 activates the operation interval signal OPSEC in response to the start enable signal STEN and deactivates the operation interval signal OPSEC in response to the fourth reference signal RF4. That is, the mode setting unit 303 may allow the enable control circuit 30 to enter the operation mode in response to the start enable signal STEN, and may allow the enable control circuit 30 to exit from the operation mode in response to the fourth reference signal RF4.

Figure 6:
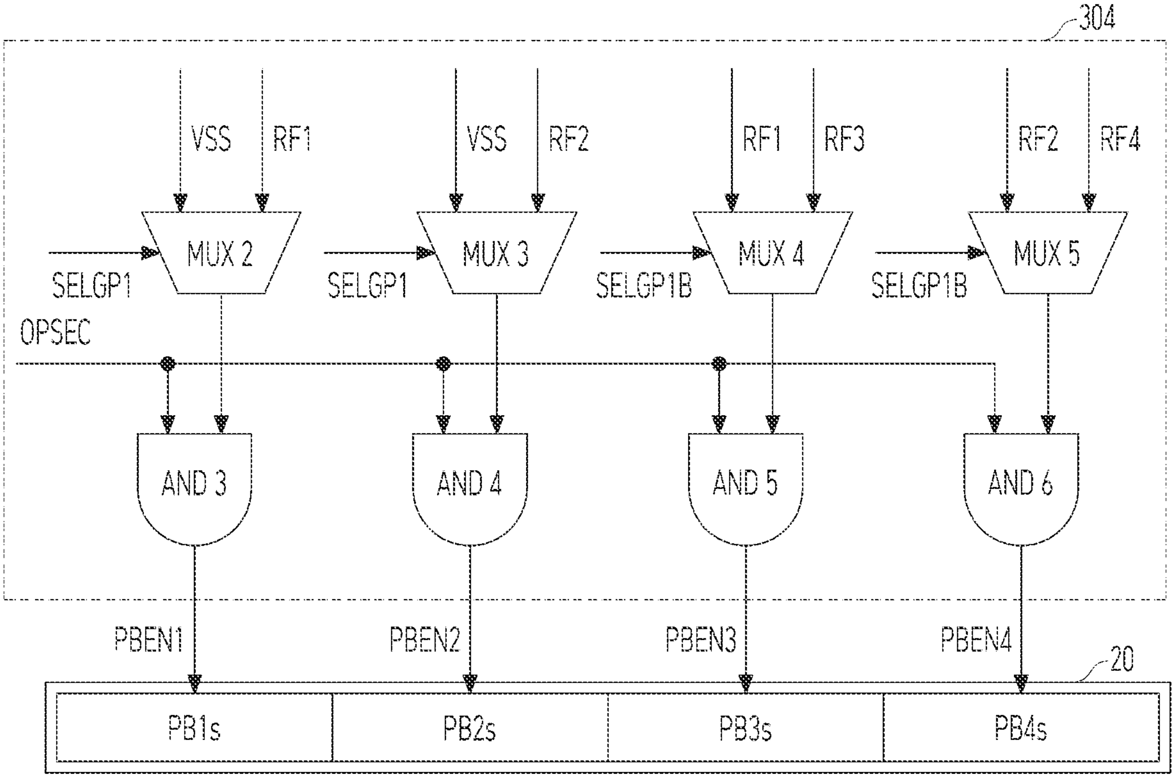
FIG. 6 is a diagram for describing a second toggling control unit, among the components of the enable control circuit disclosed in FIG. 2.

FIG. 6 is a diagram for describing the second toggling control unit 304, among the components of the enable control circuit 30 disclosed in FIG. 2.

Referring to FIG. 6, the second toggling control unit 304 included in the enable control circuit 30 may include P MUXs MUX2, MUX3, MUX4, and MUX5, and P AND gates AND3, AND4, AND5, and AND6.

As described in the aforementioned description, the second toggling control unit 304 may select L group enable signals, among the P group enable signals PBEN<1:4>, in response to the group selection signals SELGP<1:2>, and may toggle the selected L group enable signals in response to the first to L-th reference signals, respectively, during the entry interval of the operation mode, that is, in the state in which the operation interval signal OPSEC has been activated. In this case, it may be seen that only the first group selection signal SELGP1 and the inversion signal SELGP1B, among the group selection signals SELGP<1:2>, are directly input to the second toggling control unit 304 illustrated in this drawing. However, as described in the aforementioned operation of the signal generation unit 301, only the first and second reference signals RF<1:2> of the four reference signals RF<1:4> may be sequentially toggled or all of the first to fourth reference signals RF<1:4> may be sequentially toggled based on the logic level of the selection control signal OPC that is generated in response to the first and second group selection signals SELGP<1:2>. Accordingly, both the first and second group selection signals SELGP<1:2> may be considered to be involved in the operation of the second toggling control unit 304.

Specifically, the P MUXs MUX2, MUX3, MUX4, and MUX5 and the P AND gates AND3, AND4, AND5, and AND6 that are included in the second toggling control unit 304 may correspond to the P group enable signals PBEN<1:4>, respectively.

In the entry interval of the operation mode in which the operation interval signal OPSEC has a logic high level, when the first group PB1$s$ is selected as an enable target because the first and second group selection signals SELGP<1:2> have a logic high level or have a logic high level and a logic low level, respectively, the MUX2 and the AND gate AND3 that are disposed at the first place in the P MUXs MUX2, MUX3, MUX4, and MUX5, and the P AND gates AND3, AND4, AND5 and AND6, may toggle the first group enable signal PBEN1 in response to the toggling of the first reference signal RF1. In the entry interval of the operation mode in which the operation interval signal OPSEC has a logic high level, when the first group PB1$s$ is not selected as an enable target because the first group selection signal SELGP1 has a logic low level, the MUX2 and the AND gate AND3 that are disposed at the first place may maintain the logic level of the first group enable signal PBEN1 to a logic low level regardless of the toggling of the first reference signal RF1. In the exit interval of the operation mode in which the operation interval signal OPSEC has a logic low level, the MUX2 and the AND gate AND3 that are disposed at the first place may maintain the logic level of the first group enable signal PBEN1 to a logic low level.

In the entry interval of the operation mode in which the operation interval signal OPSEC has a logic high level, when the second group PB2$s$ is selected as an enable target because the first and second group selection signals SELGP<1:2> have a logic high level or have a logic high level and a logic low level, respectively, the MUX3 and the AND gate AND4 that are disposed at the second place in the P MUXs MUX2, MUX3, MUX4, and MUX5, and the P AND gates AND3, AND4, AND5 and AND6 may toggle the second group enable signal PBEN2 in response to the toggling of the second reference signal RF2. In the entry interval of the operation mode in which the operation interval signal OPSEC has a logic high level, when the second group PB2$s$ is not selected as an enable target because the first group selection signal SELGP1 has a logic low level, the MUX3 and the AND gate AND4 that are disposed at the second place may maintain the logic level of the second group enable signal PBEN2 to a logic low level regardless of the toggling of the second reference signal RF2. In the exit interval of the operation mode in which the operation interval signal OPSEC has a logic low level, the MUX3 and the AND gate AND4 that are disposed at the second place may maintain the logic level of the second group enable signal PBEN2 to a logic low level.

In the entry interval of the operation mode in which the operation interval signal OPSEC has a logic high level, when the third group PB3*s* is selected as an enable target because the inversion signal SELGP1B of the first group selection signal SELGP1 and the second group selection signal SELGP2 have a logic low level and a logic high level, respectively, the MUX4 and the AND gate AND5 that are disposed at the third place in the P MUXs MUX2, MUX3, MUX4, and MUX5, and the P AND gates AND3, AND4, AND5 and AND6 may toggle the third group enable signal PBEN3 in response to the toggling of the third reference signal RF3. In the entry interval of the operation mode in which the operation interval signal OPSEC has a logic high level, when the third group PB3*s* is selected as an enable target because both the inversion signal SELGP1B of the first group selection signal SELGP1 and the second group selection signal SELGP2 have a logic high level, the MUX4 and the AND gate AND5 that are disposed at the third place may toggle the third group enable signal PBEN3 in response to the toggling of the first reference signal RF1. In the entry interval of the operation mode in which the operation interval signal OPSEC has a logic high level, when the third group PB3*s* is not selected as an enable target because both the inversion signal SELGP1B of the first group selection signal SELGP1 and the second group selection signal SELGP2 have a logic low level, the MUX4 and the AND gate AND5 that are disposed at the third place might not toggle the third group enable signal PBEN3 because the third reference signal RF3 is not toggled. In the exit interval of the operation mode in which the operation interval signal OPSEC has a logic low level, the MUX4 and the AND gate AND5 that are disposed at the third place may maintain the logic level of the third group enable signal PBEN3 to a logic low level.

In the entry interval of the operation mode in which the operation interval signal OPSEC has a logic high level, when the fourth group PB4*s* is selected as an enable target because the inversion signal SELGP1B of the first group selection signal SELGP1 and the second group selection signal SELGP2 have a logic low level and a logic high level, respectively, the MUX5 and the AND gate AND6 that are disposed at the fourth place in the P MUXs MUX2, MUX3, MUX4, and MUX5, and the P AND gates AND3, AND4, AND5 and AND6 may toggle the fourth group enable signal PBEN4 in response to the toggling of the fourth reference signal RF4. In the entry interval of the operation mode in which the operation interval signal OPSEC has a logic high level, when the fourth group PB4*s* is selected as an enable target because both the inversion signal SELGP1B of the first group selection signal SELGP1 and the second group selection signal SELGP2 have a logic high level, the MUX5 and the AND gate AND6 that are disposed at the fourth place may toggle the fourth group enable signal PBEN4 in response to the toggling of the fourth reference signal RF4. In the entry interval of the operation mode in which the operation interval signal OPSEC has a logic high level, when the fourth group PB4*s* is not selected as an enable target because both the inversion signal SELGP1B of the first group selection signal SELGP1 and the second group selection signal SELGP2 have a logic low level, the MUX5 and the AND gate AND6 that are disposed at the fourth place might not toggle the fourth group enable signal PBEN4 because the fourth reference signal RF4 is not toggled. In the exit interval of the operation mode in which the operation interval signal OPSEC has a logic low level, the MUX5 and the AND gate AND6 that are disposed at the fourth place may maintain the logic level of the fourth group enable signal PBEN4 to a logic low level.

Figure 7A:
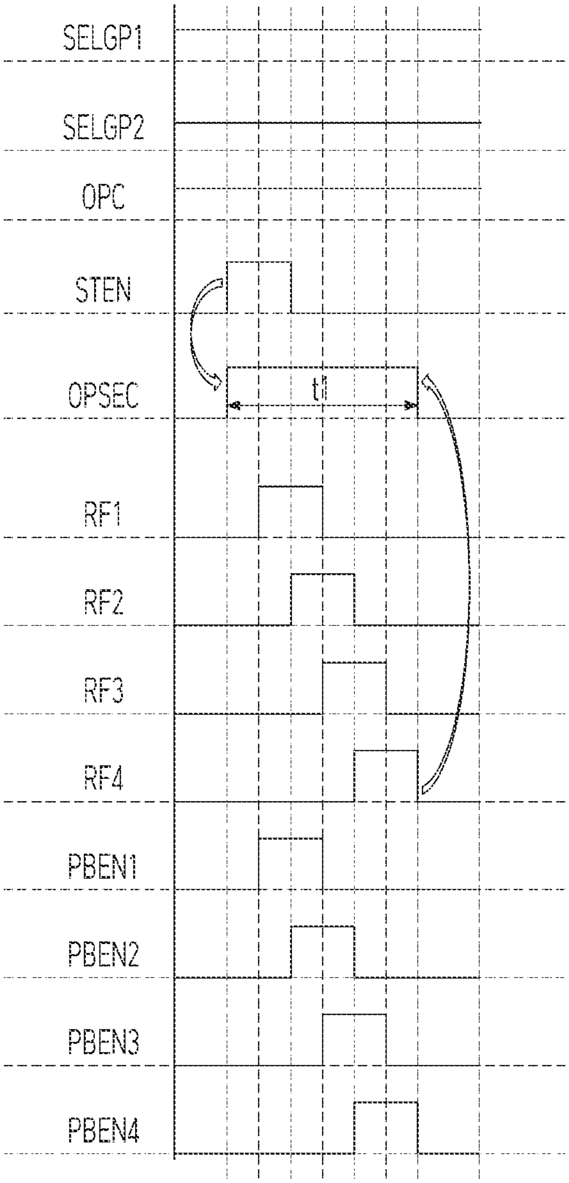
FIGS. 7A to 7C are diagrams for describing operations of the enable control circuit disclosed in FIG. 2.
Figure 7B:
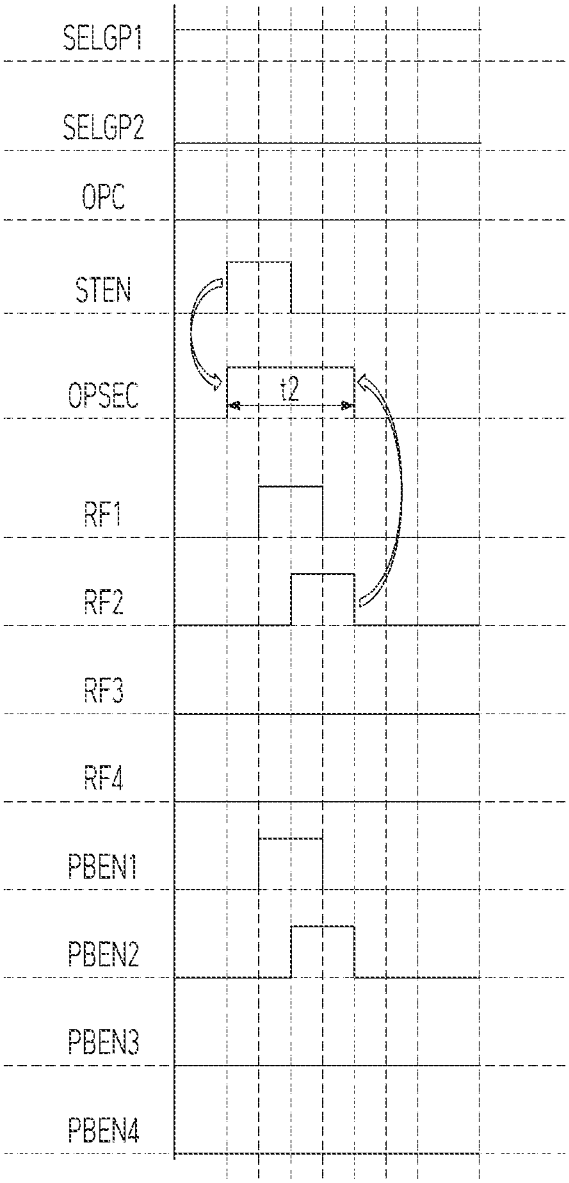
Figure 7C:
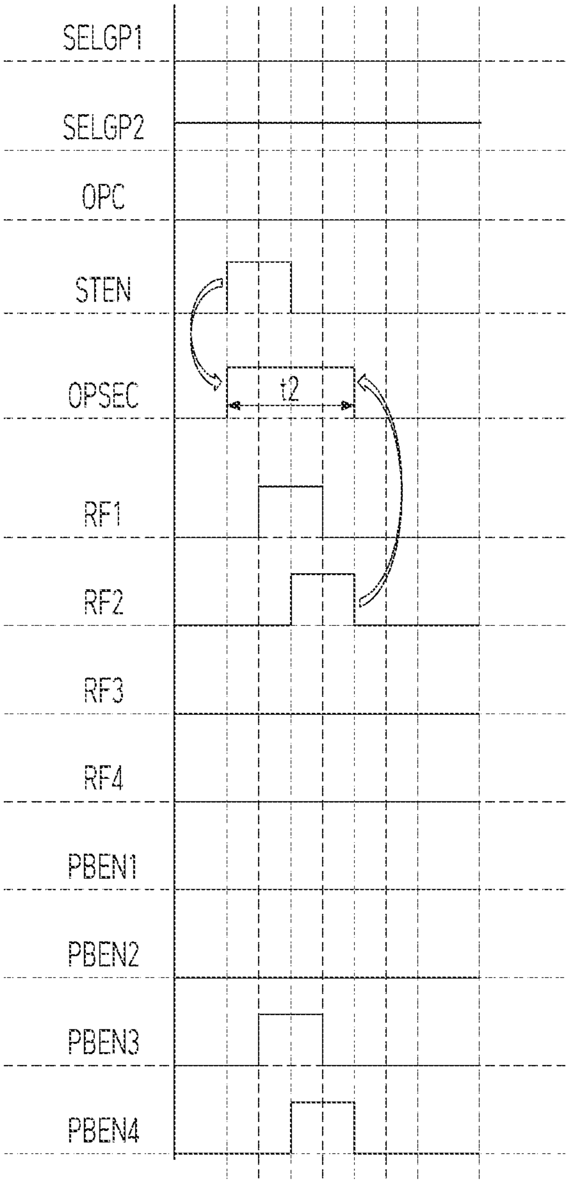

FIGS. 7A to 7C are diagrams for describing the aforementioned operation of the enable control circuit 30 disclosed in FIG. 2.

Referring to FIG. 7A, a case in which all of the four groups PB1*s*, PB2*s*, PB3*s*, and PB4*s* are selected as an enable target because both the first and second group selection signals SELGP<1:2> have a logic high level in the enable control circuit 30, is described.

Specifically, the selection control signal OPC may have a logic high level because both the first and second group selection signals SELGP<1:2> have a logic high level. In such a state, the enable control circuit 30 may enter the operation mode as the operation interval signal OPSEC is activated to a logic high level in response to the start enable signal STEN being toggled.

The first to fourth group enable signals PBEN<1:4> may be sequentially toggled in response to the first to fourth reference signals RF<1:4> being sequentially toggled in the interval in which the operation interval signal OPSEC maintains a logic high level. The first to fourth groups PB1*s*, PB2*s*, PB3*s*, and PB4*s* may be sequentially enabled in response to the first to fourth group enable signals PBEN<1:4> being sequentially toggled as described above.

The enable control circuit 30 may exit from the operation mode because the operation interval signal OPSEC is deactivated to a logic low level in response to the toggling of the fourth reference signal RF4, that is, the fourth reference signal in the first to fourth reference signals RF<1:4>.

It may be seen that the operation interval signal OPSEC maintains the state in which the operation interval signal OPSEC has been activated for a first time t1 because the operation interval signal OPSEC is activated in response to the first reference signal RF1, that is, the first reference signal in the first to fourth reference signals RF<1:4>, being toggled and is deactivated in response to the toggling of the fourth reference signal RF4, that is, the fourth reference signal in the first to fourth reference signals RF<1:4>, as described above. In this case, the activation interval of the operation interval signal OPSEC may mean the length of the interval in which the enable control circuit 30 has entered the operation mode.

The enable control circuit 30 may enter the operation mode for the first time t1 in order to sequentially enable all of the first to fourth groups PB1*s*, PB2*s*, PB3*s*, and PB4*s* when both the first and second group selection signals SELGP<1:2> have a logic high level.

Referring to FIG. 7B, a case in which only the first and second groups PB1*s* and PB2*s*, among the four groups PB1*s*, PB2*s*, PB3*s*, and PB4*s*, are selected as an enable target because the first group selection signal SELGP1 has a logic high level and the second group selection signal SELGP2 has a logic low level in the enable control circuit 30 is described.

Specifically, the selection control signal OPC may have a logic low level because the first group selection signal SELGP1 has a logic high level and the second group selection signal SELGP2 has a logic low level. In such a state, the enable control circuit 30 may enter the operation mode as the operation interval signal OPSEC is activated to a logic high level in response to the start enable signal STEN being toggled.

The first and second group enable signals PBEN<1:2> may be sequentially toggled in response to the first and second reference signals RF<1:2> being sequentially toggled in the interval in which the operation interval signal OPSEC maintains a logic high level. The first and second groups PB1s and PB2s may be sequentially enabled in response to the first and second group enable signals PBEN<1:2> being sequentially toggled as described above.

The enable control circuit 30 may exit from the operation mode as the operation interval signal OPSEC is deactivated to a logic low level in response to the second reference signal RF2, that is, the second reference signal in the first to fourth reference signals RF<1:4>, being toggled.

It may be seen that the operation interval signal OPSEC maintains the state in which the operation interval signal OPSEC has been activated for a second time t2 because the operation interval signal OPSEC is activated in response to the first reference signal RF1, that is, the first reference signal in the first to fourth reference signals RF<1:4>, being toggled and is deactivated in response to the toggling of the second reference signal RF2, that is, the second reference signal in the first to fourth reference signals RF<1:4>, as described above. In this case, the activation interval of the operation interval signal OPSEC may mean the length of the interval in which the enable control circuit 30 has entered the operation mode.

The enable control circuit 30 may enter the operation mode for the second time t2 in order to sequentially enable only the first and second groups PB1s and PB2s when the first group selection signal SELGP1 has a logic high level and the second group selection signal SELGP2 has a logic low level. In this case, it may be seen that the second time t2 is a time shorter than the first time t1 of FIG. 7A. That is, the enable control circuit 20 may control the length of the second time t2 for which the enable control circuit 20 enters the operation mode in order to sequentially enable only the two groups PB1s and PB2s, among the four groups PB1s, PB2s, PB3s, and PB4s, to be shorter than the length of the first time t1 for which the enable control circuit 20 enters the operation mode in order to sequentially enable all of the four groups PB1s, PB2s, PB3s, and PB4s.

Referring to FIG. 7C, a case in which only the third and fourth groups PB3s and PB4s, among the four groups PB1s, PB2s, PB3s, and PB4s, are selected as an enable target when the first group selection signal SELGP1 has a logic low level and the second group selection signal SELGP2 has a logic high level in the enable control circuit 30 is described.

Specifically, the selection control signal OPC may have a logic low level because the first group selection signal SELGP1 has a logic low level and the second group selection signal SELGP2 has a logic high level. In such a state, the enable control circuit 30 may enter the operation mode as the operation interval signal OPSEC is activated to a logic high level in response to the start enable signal STEN being toggled.

The third and fourth group enable signals PBEN<3:4> may be sequentially toggled in response to the first and second reference signals RF<1:2> being sequentially toggled in the interval in which the operation interval signal OPSEC is maintained to a logic high level. The third and fourth groups PB3s and PB4s may be sequentially enabled in response to the third and fourth group enable signals PBEN<3:4> being sequentially toggled as described above.

The enable control circuit 30 may exit from the operation mode as the operation interval signal OPSEC is deactivated to a logic low level in response to the second reference signal RF2, that is, the second reference signal in the first to fourth reference signals RF<1:4>, being toggled.

It may be seen that the operation interval signal OPSEC maintains the state in which the operation interval signal OPSEC has been activated for a second time t2 because the operation interval signal OPSEC is activated in response to the first reference signal RF1, that is, the first reference signal in the first to fourth reference signals RF<1:4>, being toggled and is deactivated in response to the second reference signal RF2, that is, the second reference signal in the first to fourth reference signals RF<1:4>, being toggled as described above. In this case, the activation interval of the operation interval signal OPSEC may mean the length of the interval in which the enable control circuit 30 has entered the operation mode.

The enable control circuit 30 may enter the operation mode for the second time t2 in order to sequentially enable only the third and fourth groups PB3s and PB4s when the first group selection signal SELGP1 has a logic low level and the second group selection signal SELGP2 has a logic high level. In this case, it may be seen that the second time t2 is a time shorter than the first time t1 of FIG. 7A. That is, the enable control circuit 20 may control the length of the second time t2 for which the enable control circuit 30 enters the operation mode in order to sequentially enable only the two groups PB3s and PB4s, among the four groups PB1s, PB2s, PB3s, and PB4s, to be shorter than the length of the first time t1 for which the enable control circuit 30 enters the operation mode in order to sequentially enable all of the four groups PB1s, PB2s, PB3s, and PB4s.

Figure 8:
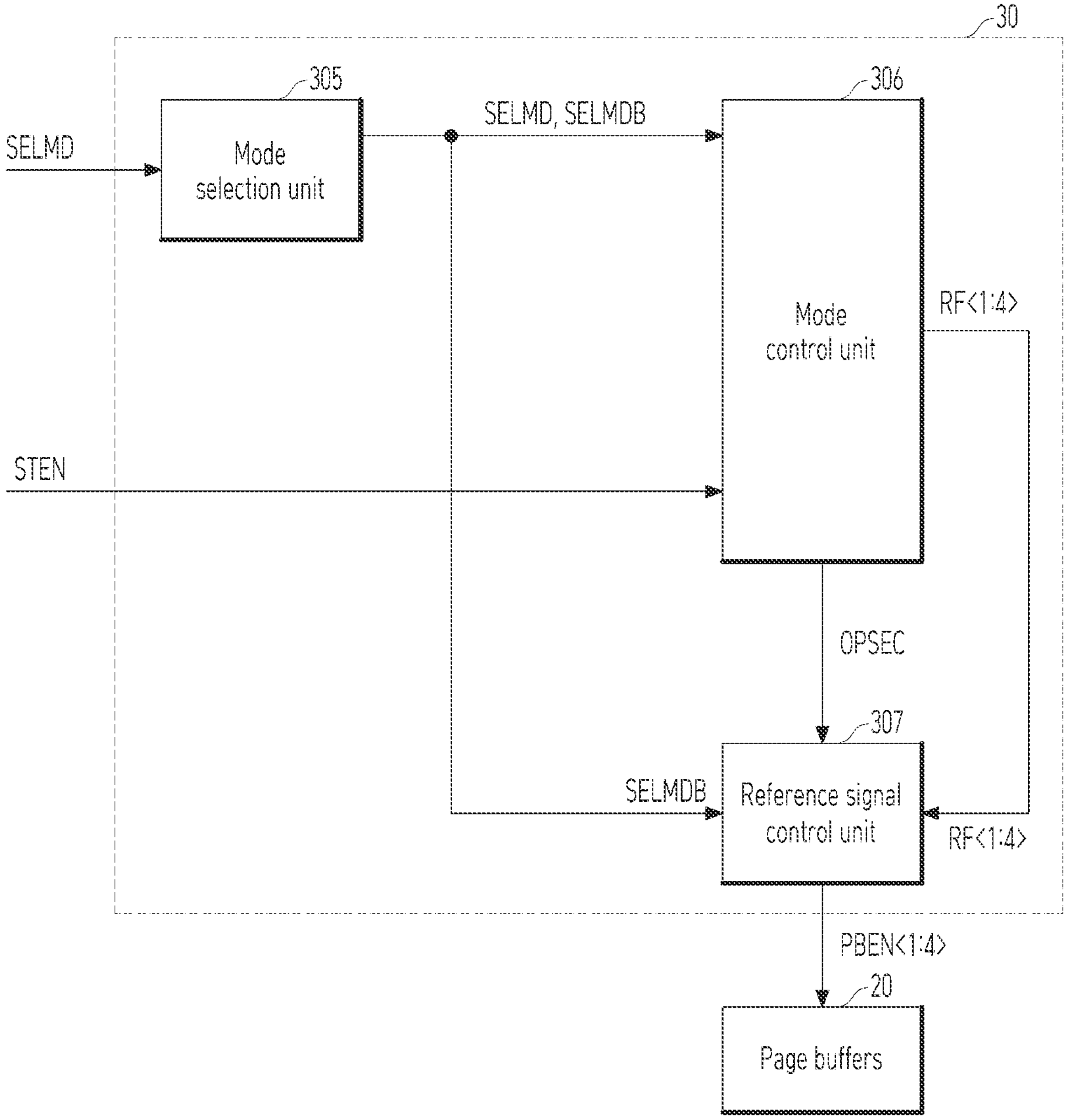
FIG. 8 is a diagram for describing a second embodiment of the enable control circuit, among the components of the memory device disclosed in FIG. 1 according to an embodiment of the present disclosure.

FIG. 8 is a diagram for describing a second embodiment of the enable control circuit, among the components of the memory device disclosed in FIG. 1 according to an embodiment of the present disclosure.

Referring to FIG. 8, the enable control circuit 30 having the second embodiment, which has been described with reference to FIG. 1, may include a mode selection unit 305, a mode control unit 306, and a reference signal control unit 307.

The enable control circuit 30 may divide page buffers 20 into P groups PB1s, PB2s, PB3s, and PB4s. In this case, P may be a natural number equal to or greater than 2.

The enable control circuit 30 may enter a first operation mode for accessing the memory cell array 10 of FIG. 1, may then sequentially enable the P groups PB1s, PB2s, PB3s, and PB4s, and may exit from the first operation mode.

Furthermore, the enable control circuit 30 may enter a second operation mode for accessing the memory cell array 10, may then simultaneously enable the P groups PB1s, PB2s, PB3s, and PB4s, and may exit from the second operation mode. In this case, the length of an entry interval of the second operation mode may be shorter than the length of an entry interval of the first operation mode.

According to an embodiment, when P is 4, the enable control circuit 30 may divide the page buffers 20 into four groups PB1s, PB2s, PB3s, and PB4s.

Accordingly, the enable control circuit 30 may sequentially enable the four groups PB1s, PB2s, PB3s, and PB4s during the entry interval of the first operation mode, and may simultaneously enable the four groups PB1s, PB2s, PB3s, and PB4s during the entry interval of the second operation mode, which is shorter than the length of the entry interval of the first operation mode. In this case, the length of the entry interval of the second operation mode may be half (½) the length of the entry interval of the first operation mode.

More specifically, the mode selection unit 305 included in the enable control circuit 30 may generate a mode control signal SELMD or SELMDB for selecting one of the first and second operation modes in response to a mode selection signal SELMD.

The mode control unit 306 included in the enable control circuit 30 may enter the first operation mode in response to the mode control signal SELMD or SELMDB and a start enable signal STEN, and may exit from the first operation mode in response to P reference signals RF<1:4> being sequentially toggled.

According to an embodiment, when P is 4, the mode control unit 306 may enter the first operation mode in response to the mode control signal SELMD or SELMDB, may then toggle a first reference signal RF1 among the reference signals RF<1:4>, in response to the start enable signal STEN, may toggle a second reference signal RF2 among the reference signals RF<1:4>, in response to the toggling of the first reference signal RF1, may toggle a third reference signal RF3 among the reference signals RF<1:4>, in response to the toggling of the second reference signal RF2, and may toggle a fourth reference signal RF4 among the reference signals RF<1:4>, in response to the toggling of the third reference signal RF3.

The mode control unit 306 may enter the second operation mode in response to the mode control signal SELMD or SELMDB and the start enable signal STEN, and may then exit from the second operation mode in response to the first to K-th reference signals, among the P reference signals RF<1:4>, being sequentially toggled. In this case, K may be a natural number less than P. As described above, the length of the second operation mode may be shorter than the length of the first operation mode under any circumstance because K is a natural number less than P.

According to an embodiment, when P is 4 and K is 1, the mode control unit 306 may enter the second operation mode in response to the mode control signal SELMD or SELMDB, and may then toggle only the first reference signal RF1 in response to the start enable signal STEN.

According to another embodiment, when P is 4 and K is 2, the mode control unit 306 may enter the second operation mode in response to the mode control signal SELMD or SELMDB, may then toggle the first reference signal RF1 in response to the start enable signal STEN, may toggle the second reference signal RF2 in response to the toggling of the first reference signal RF1, and might not toggle the third and fourth reference signals RF<3:4>.

According to still another embodiment, when P is 4 and K is 3, the mode control unit 306 may enter the second operation mode in response to the mode control signal SELMD or SELMDB, may then toggle the first reference signal RF1 in response to the start enable signal STEN, may toggle the second reference signal RF2 in response to the toggling of the first reference signal RF1, may toggle the third reference signal RF3 in response to the toggling of the second reference signal RF2, and might not toggle the fourth reference signal RF4.

The reference signal control unit 307 included in the enable control circuit 30 may sequentially toggle the P group enable signals PBEN<1:4> in response to the P reference signals RF<1:4> being sequentially toggled in the first operation mode.

In this case, each of the P group enable signals PBEN<1:4> may be a signal for enabling each of the P groups PB1_s_, PB2_s_, PB3_s_, and PB4_s_. For example, when a first group enable signal PBEN1, among the P group enable signals PBEN<1:4>, is activated, the first group PB1_s_, among the P groups PB1_s_, PB2_s_, PB3_s_, and PB4_s_, may be enabled. As another example, when a third group enable signal PBEN3, among the P group enable signals PBEN<1:4>, is activated, the third group PB3_s_, among the P groups PB1_s_, PB2_s_, PB3_s_, and PB4_s_, may be enabled.

According to an embodiment, when P is 4, the reference signal control unit 307 may toggle the four group enable signals PBEN<1:4> in response to the first to fourth reference signals RF<1:4>, respectively, in the entry interval of the first operation mode.

In the second operation mode, the reference signal control unit 307 may simultaneously activate the P group enable signals PBEN<1:4> in response to the first reference signal RF1, among the P reference signals RF<1:4>, being toggled, and may simultaneously deactivate the P group enable signals PBEN<1:4> in response to the toggling of a K-th reference signal (e.g., one of the reference signals RF<1:3>).

According to an embodiment, when P is 4 and K is 2, in the entry interval of the second operation mode, the reference signal control unit 307 may simultaneously activate the four group enable signals PBEN<1:4> in response to the first reference signal RF1 being toggled, and may simultaneously deactivate the four group enable signals PBEN<1:4> in response to the toggling of the second reference signal RF2.

FIGS. 9 to 11B disclose detailed circuit constructions of the mode selection unit 305, the mode control unit 306, and the reference signal control unit 307 that are included in the enable control circuit 30 when P is 4 and K is 2.

However, the circuit diagrams disclosed in FIGS. 9 to 11B are merely embodiments and may be reconstructed in different forms depending on a designer's choice.

Figure 9:
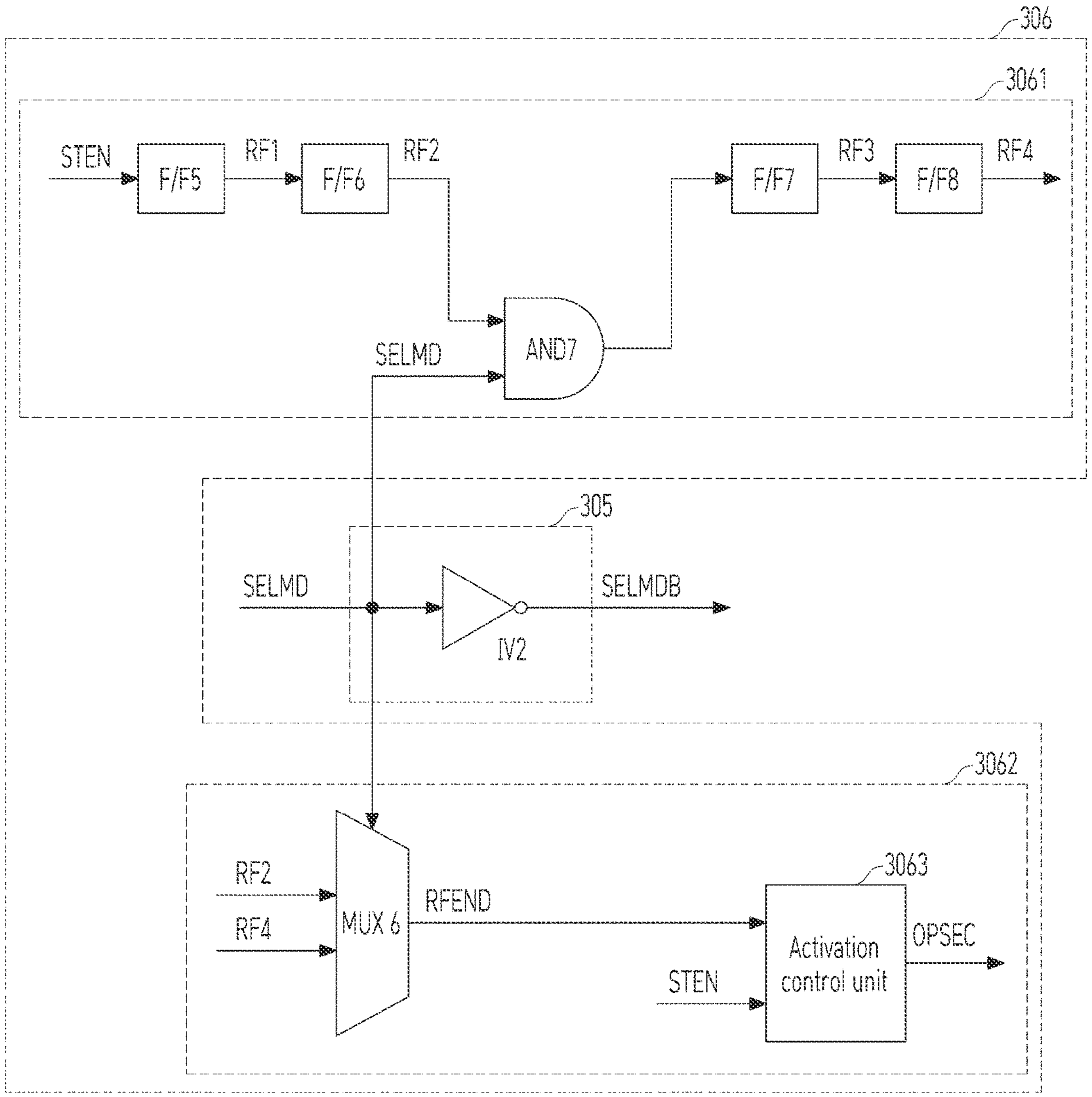
FIG. 9 is a diagram for describing a mode selection unit and a mode control unit, among the components of the enable control circuit disclosed in FIG. 8.

FIG. 9 is a diagram for describing a mode selection unit 305 and a mode control unit 306, among the components of the enable control circuit 30 disclosed in FIG. 8.

Referring to FIG. 9, the mode selection unit 305 included in the enable control circuit 30 may include an inverter IV2. The inverter IV2 may output an inversion mode selection signal SELMDB by inverting the mode selection signal SELMD.

According to an embodiment, when the mode selection signal SELMD has a logic high level and the inversion mode selection signal SELMDB has a logic low level, the enable control circuit 30 may enter the first operation mode. In contrast, when the mode selection signal SELMD has a logic low level and the inversion mode selection signal SELMDB has a logic high level, the enable control circuit 30 may enter the second operation mode.

The mode control unit 306 included in the enable control circuit 30 may include an output selection unit 3061 and an exit control unit 3062.

In this case, the output selection unit 3061 may include P flip-flops F/F5, F/F6, F/F7, and F/F8 that are connected in a daisy chain form, and an AND gate AND7.

The output selection unit 3061 may output the P reference signals RF<1:4> to output stages of the first to P-th flip-flops F/F5 to F/F8, respectively, in response to the start enable signal STEN that is applied to an input stage of the first flip-flop F/F5 in the first operation mode that the enable control circuit 30 enters in response to the mode selection signal SELMD.

The output selection unit 3061 may select a K-th flip-flop (e.g., one of the flip-flops F/F5 to F/F7), among the P flip-flops F/F5, F/F6, F/F7, and F/F8, in the second operation mode that the enable control circuit 30 enters in response to the mode selection signal SELMD. Further, the output selection unit 3061 may output one or more K reference signals RF1, RF<1:2>, or RF<1:3> to the output stage of each of the first to K-th flip-flops (F/F5, F/F5 to F/F6, or F/F5 to F/F7) in response to the start enable signal STEN that is applied to the input stage of the first flip-flop F/F5.

Specifically, each of the P flip-flops F/F5, F/F6, F/F7, and F/F8 included in the output selection unit 3061 may be a D flip-flop. That is, each of the P flip-flops F/F5, F/F6, F/F7, and F/F8 may delay a signal that is applied to its input stage and output the signal to its output stage. It may be seen that the four flip-flops F/F5, F/F6, F/F7, and F/F8 have been connected in the daisy chain form in the drawing because P is 4 in the aforementioned description.

The AND gate AND7 included in the output selection unit 3061 may select the K-th flip-flop (e.g., one of the flip-flops F/F5 to F/F7), among the P flip-flops F/F5, F/F6, F/F7, and F/F8, in the second operation mode that the enable control circuit 30 enters in response to the mode selection signal SELMD. The AND gate AND7 may select whether to transfer a signal that is output by the output stage of the second flip-flop F/F6 to the input stage of the third flip-flop F/F7 in response to the mode selection signal SELMD because K is 2 in the aforementioned description. The second flip-flop F/F6 is disposed at the second place in the four flip-flops F/F5, F/F6, F/F7, and F/F8, while the third flip-flop F/F7 is disposed at the third place in the four flip-flops F/F5, F/F6, F/F7, and F/F8, According to an embodiment, when the logic level of the mode selection signal SELMD is set as a logic high level and the enable control circuit 30 enters the first operation mode, the first reference signal RF1 may be output to the output stage of the first flip-flop F/F5 in response to the start enable signal STEN being applied to the input stage of the first flip-flop F/F5 that is disposed at the first place in the four flip-flops F/F5, F/F6, F/F7, and F/F8. The second reference signal RF2 may be output to the output stage of the second flip-flop F/F6 in response to the first reference signal RF1 being applied to an input stage of the second flip-flop F/F6. Thereafter, the second reference signal RF2 may be transferred to an input stage of the third flip-flop F/F7 through the AND gate AND7. The third reference signal RF3 may be output to the output stage of the third flip-flop F/F7 in response to the second reference signal RF2 being applied to the input stage of the third flip-flop F/F7 as described above. The fourth reference signal RF4 may be output to the output stage of the fourth flip-flop F/F8 in response to the third reference signal RF3 being applied to the input stage of the fourth flip-flop F/F8. In the first operation mode, the output selection unit 3061 may sequentially toggle the first to fourth reference signals RF<1:4> in response to the start enable signal STEN being toggled.

According to another embodiment, when the logic level of the mode selection signal SELMD is set as a logic low level, the enable control circuit 30 enters the second operation mode, and K is 2, the first reference signal RF1 may be output to the output stage of the first flip-flop F/F5 in response to the start enable signal STEN being applied to the input stage of the first flip-flop F/F5 that is disposed at the first place. The second reference signal RF2 may be output to the output stage of the second flip-flop F/F6 in response to the first reference signal RF1 being applied to the input stage of the second flip-flop F/F6. Thereafter, the second reference signal RF2 might not be transferred to the input stage of the third flip-flop F/F7 through the AND gate AND7. In the second operation mode, when K is 2, the output selection unit 3061 may sequentially toggle the first and second reference signals RF<1:2> in response to the start enable signal STEN being toggled.

The exit control unit 3062 may include a multiplexer (MUX) MUX6 and an activation control unit 3063. As described in the aforementioned description, the exit control unit 3062 may allow the enable control circuit 30 to enter the first operation mode or the second operation mode by activating the operation interval signal OPSEC in response to the start enable signal STEN, may allow the enable control circuit 30 to exit from the first operation mode in response to the toggling of a P-th reference signal RF2, among the P reference signals RF<1:4> that are sequentially toggled in the first operation mode, and may allow the enable control circuit 30 to exit from the second operation mode in response to the toggling of the K-th reference signal RF2, among the K reference signals RF<1:2> that are sequentially toggled in the second operation mode.

Specifically, the MUX6 included in the exit control unit 3062 may select one of the second reference signal RF2 and the fourth reference signal RF4 and output, as a signal RFEND, the selected reference signal in response to the mode selection signal SELMD. Such an operation of the MUX6 may be performed because P is 4 and K is 2 in the aforementioned description.

The activation control unit 3063 included in the exit control unit 3062 may activate the operation interval signal OPSEC in response to the start enable signal STEN, and may deactivate the operation interval signal OPSEC in response to the output signal RFEND of the MUX6.

According to an embodiment, when the logic level of the mode selection signal SELMD is set as a logic high level and the enable control circuit 30 enters the first operation mode, the signal RFEND that is output by the MUX6 may be the fourth reference signal RF4. In this case, the activation control unit 3063 may be in the state in which the activation control unit 3063 activates the operation interval signal OPSEC in response to the start enable signal STEN and deactivates the operation interval signal OPSEC in response to the sixth reference signal RF6. That is, the exit control unit 3062 may allow the enable control circuit 30 to enter the first operation mode in response to the start enable signal STEN, and may then allow the enable control circuit 30 to exit from the first operation mode in response to the fourth reference signal RF4.

According to another embodiment, when the logic level of the mode selection signal SELMD is set as a logic low level and the enable control circuit 30 enters the second operation mode, the signal RFEND that is output by the MUX6 may be the second reference signal RF2. In this case, the activation control unit 3063 may be in the state in which the activation control unit 3063 activates the operation interval signal OPSEC in response to the start enable signal STEN and deactivates the operation interval signal OPSEC in response to the second reference signal RF2. That is, the exit control unit 3062 may allow the enable control circuit 30 to enter the second operation mode in response to the start enable signal STEN, and may then allow the enable control circuit 30 to exit from the second operation mode in response to the second reference signal RF2.

Figure 10:
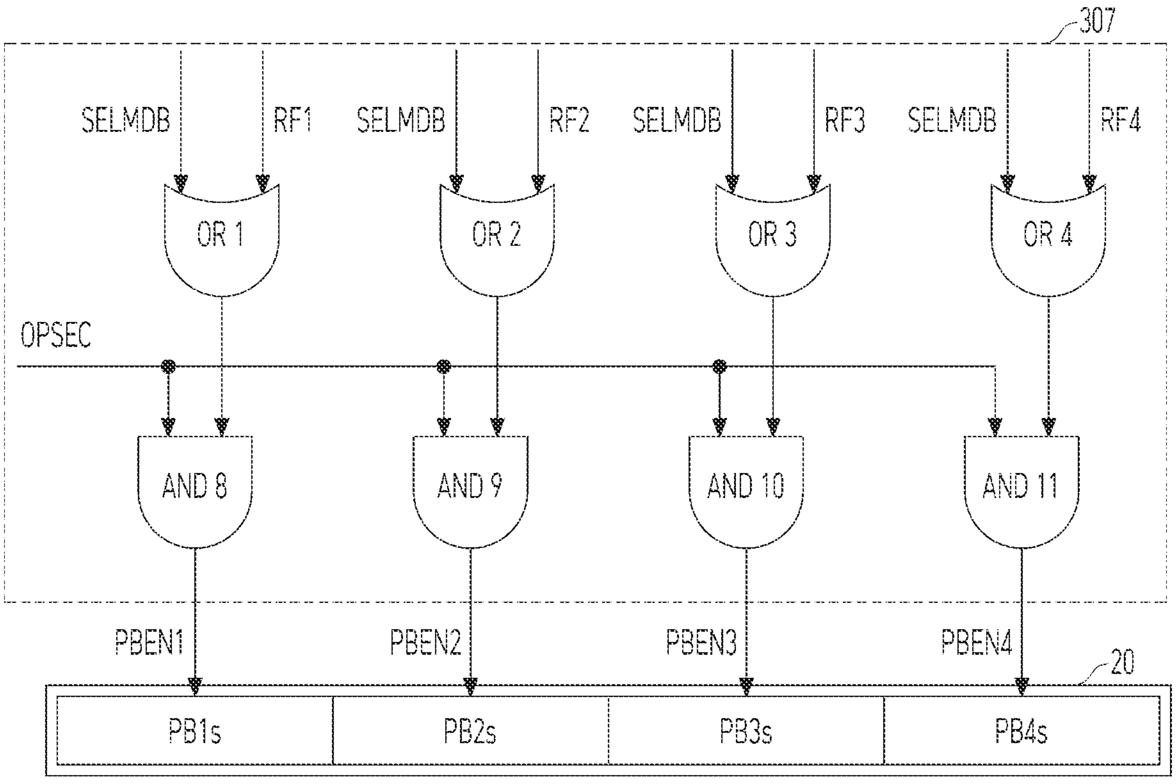
FIG. 10 is a diagram for describing a reference signal control unit, among the components of the enable control circuit disclosed in FIG. 8.

FIG. 10 is a diagram for describing the reference signal control unit 307, among the components of the enable control circuit 30 disclosed in FIG. 8.

Referring to FIG. 10, the reference signal control unit 307 included in the enable control circuit 30 may include P OR gates OR1, OR2, OR3, and OR4, and P AND gates AND8, AND9, AND10, and AND11.

As described in the aforementioned description, while the operation interval signal OPSEC maintains a logic high level after the enable control circuit 30 enters the first operation mode in response to the mode selection signal SELMD, the reference signal control unit 307 may sequentially toggle the P group enable signals PBEN<1:4> in response to the P reference signals RF<1:4> being sequentially toggled.

While the operation interval signal OPSEC maintains a logic high level after the enable control circuit 30 enters the second operation mode in response to the mode selection signal SELMD, the reference signal control unit 307 may simultaneously activate the four group enable signals PBEN<1:4> in response to the first reference signal RF1 being toggled, and may simultaneously deactivate the four group enable signals PBEN<1:4> in response to the toggling of the second reference signal RF2.

Specifically, each of the P OR gates OR1, OR2, OR3, and OR4 and each of the P AND gates AND8, AND9, AND10, and AND11, which are included in the reference signal control unit 307, may correspond to each of the P group enable signals PBEN<1:4>.

The OR gate OR1 and the AND gate AND8 that are disposed at the first place in the P OR gates OR1, OR2, OR3, and OR4 and the P AND gates AND8, AND9, AND10, and AND11 may toggle the first group enable signal PBEN1 in response to the toggling of the first reference signal RF1, while the operation interval signal OPSEC has a logic high level in the first operation mode in which the mode selection signal SELMD has a logic high level and the inversion mode selection signal SELMDB has a logic low level. Furthermore, the OR gate OR1 and the AND gate AND8 that are disposed at the first place may maintain the logic level of the first group enable signal PBEN1 to a logic high level regardless of the toggling of the first reference signal RF1, while the operation interval signal OPSEC has a logic high level in the second operation mode in which the mode selection signal SELMD has a logic low level and the inversion mode selection signal SELMDB has a logic high level. Furthermore, the OR gate OR1 and the AND gate AND8 that are disposed at the first place may maintain the logic level of the first group enable signal PBEN1 to a logic low level in the exit interval of the first operation mode or the second operation mode in which the operation interval signal OPSEC has a logic low level.

The OR gate OR2 and the AND gate AND9 that are disposed at the second place in the P OR gates OR1, OR2, OR3, and OR4 and the P AND gates AND8, AND9, AND10, and AND11 may toggle the second group enable signal PBEN2 in response to the toggling of the second reference signal RF2, while the operation interval signal OPSEC has a logic high level in the first operation mode in which the mode selection signal SELMD has a logic high level and the inversion mode selection signal SELMDB has a logic low level. Furthermore, the OR gate OR2 and the AND gate AND9 that are disposed at the second place may maintain the logic level of the second group enable signal PBEN2 to a logic high level regardless of the toggling of the second reference signal RF2, while the operation interval signal OPSEC has a logic high level in the second operation mode in which the mode selection signal SELMD has a logic low level and the inversion mode selection signal SELMDB has a logic high level. Furthermore, the OR gate OR2 and the AND gate AND9 that are disposed at the second place may maintain the logic level of the second group enable signal PBEN2 to a logic low level in the exit interval of the first operation mode or the second operation mode in which the operation interval signal OPSEC has a logic low level.

The OR gate OR3 and the AND gate AND10 that are disposed at the third place in the P OR gates OR1, OR2, OR3, and OR4 and the P AND gates AND8, AND9, AND10, and AND11 may toggle the third group enable signal PBEN3 in response to the toggling of the third reference signal RF3, while the operation interval signal OPSEC has a logic high level in the first operation mode in which the mode selection signal SELMD has a logic high level and the inversion mode selection signal SELMDB has a logic low level. Furthermore, the OR gate OR3 and the AND gate AND10 that are disposed at the third place may maintain the logic level of the third group enable signal PBEN3 to a logic high level regardless of the toggling of the third reference signal RF3, while the operation interval signal OPSEC has a logic high level in the second operation mode in which the mode selection signal SELMD has a logic low level and the inversion mode selection signal SELMDB has a logic high level. Furthermore, the OR gate OR3 and the AND gate AND10 that are disposed at the third place may maintain the logic level of the third group enable signal PBEN3 to a logic low level in the exit interval of the first operation mode or the second operation mode in which the operation interval signal OPSEC has a logic low level.

The OR gate OR4 and the AND gate AND11 that are disposed at the fourth place in the P OR gates OR1, OR2, OR3, and OR4 and the P AND gates AND8, AND9, AND10, and AND11 may toggle the fourth group enable signal PBEN4 in response to the toggling of the fourth reference signal RF4, while the operation interval signal OPSEC has a logic high level in the first operation mode in which the mode selection signal SELMD has a logic high level and the inversion mode selection signal SELMDB has a logic low level. Furthermore, the OR gate OR4 and the AND gate AND11 that are disposed at the fourth place may maintain the logic level of the fourth group enable signal PBEN4 to a logic high level regardless of the toggling of the fourth reference signal RF4, while the operation interval signal OPSEC has a logic high level in the second operation mode in which the mode selection signal SELMD has a logic low level and the inversion mode selection signal SELMDB has a logic high level. Furthermore, the OR gate OR4 and the AND gate AND11 that are disposed at the fourth place may maintain the logic level of the fourth group enable signal PBEN4 to a logic low level in the exit interval of the first operation mode or the second operation mode in which the operation interval signal OPSEC has a logic low level.

Figure 11A:
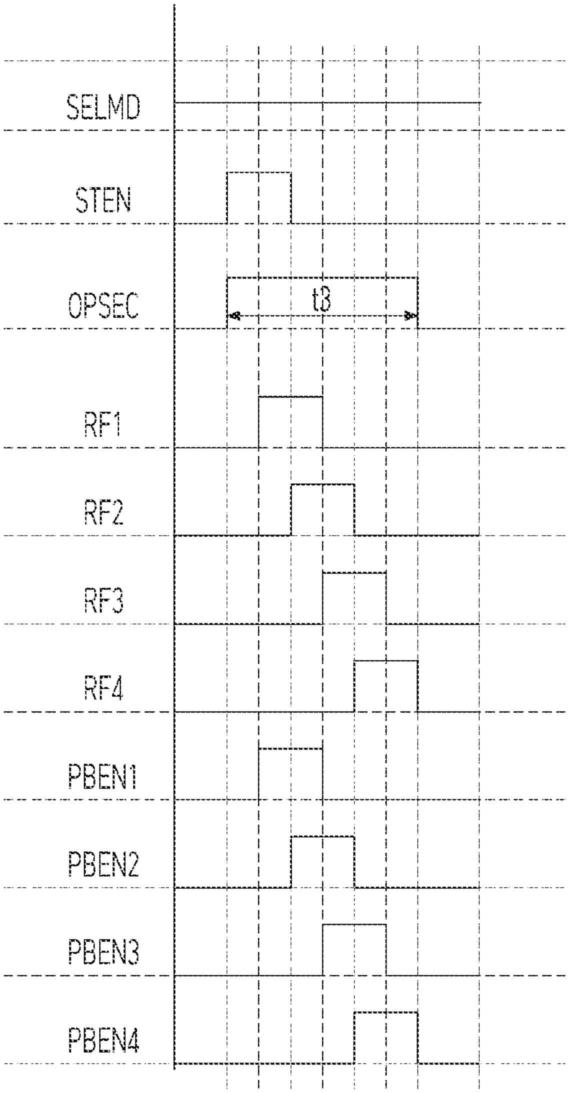
FIGS. 11A and 11B are diagrams for describing operations of the enable control circuit disclosed in FIG. 8.
Figure 11B:
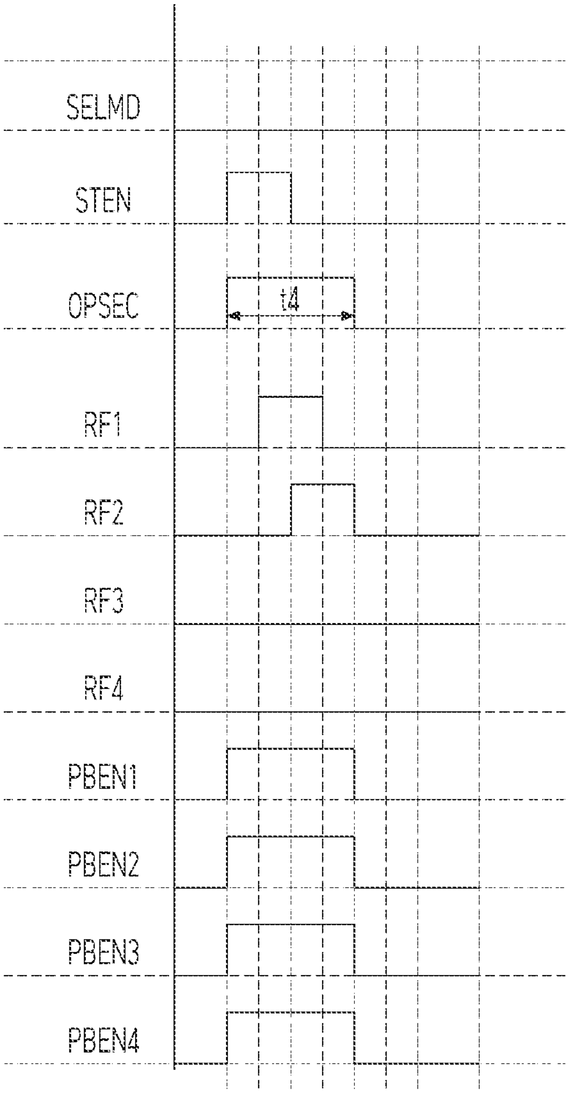

FIGS. 11A and 11B are diagrams for describing operations of the enable control circuit 30 disclosed in FIG. 8.

Referring to FIG. 11A, a case in which the enable control circuit 30 enters the first operation mode because the mode selection signal SELMD has a logic high level in the enable control circuit 30 is described.

Specifically, the enable control circuit 30 may enter the first operation mode as the operation interval signal OPSEC is activated to a logic high level in response to the start enable signal STEN being toggled because the mode selection signal SELMD has a logic high level. The first to fourth group enable signals PBEN<1:4> may be sequentially toggled in response to the first to fourth reference signals RF<1:4> being sequentially toggled in the interval in which the operation interval signal OPSEC maintains a logic high level. The first to fourth groups PB1*s*, PB2*s*, PB3*s*, and PB4*s* may be sequentially enabled in response to the first to fourth group enable signals PBEN<1:4> being sequentially toggled as described above.

The enable control circuit 30 may exit from the first operation mode as the operation interval signal OPSEC is deactivated to a logic low level in response to the toggling of the fourth reference signal RF4, that is, the fourth reference signal in the first to fourth reference signals RF<1:4>.

It may be seen that the operation interval signal OPSEC maintains the state in which the operation interval signal OPSEC has been activated for a third time t3 because the operation interval signal OPSEC is activated in response to the first reference signal RF1 in the first to fourth reference signals RF<1:4>, being toggled and is deactivated in response to the toggling of the fourth reference signal RF4 in the first to fourth reference signals RF<1:4>, as described above. In this case, the activation interval of the operation interval signal OPSEC may mean the length of the interval in which the enable control circuit 30 has entered the first operation mode.

The enable control circuit 30 may enter the first operation mode for the third time t3 in order to sequentially enable all of the first to fourth groups PB1*s*, PB2*s*, PB3*s*, and PB4*s* when the mode selection signal SELMD has a logic high level.

Referring to FIG. 11B, a case in which the enable control circuit 30 enters the second operation mode because the mode selection signal SELMD has a logic low level is described.

Specifically, the enable control circuit 30 may enter the second operation mode as the operation interval signal OPSEC is activated to a logic high level in response to the start enable signal STEN being toggled because the mode selection signal SELMD has a logic low level.

All of the first to fourth group enable signals PBEN<1:4> may be simultaneously activated to a logic high level in response to the operation interval signal OPSEC being activated to a logic high level. The first to fourth groups PB1*s*, PB2*s*, PB3*s*, and PB4*s* may be simultaneously enabled in response to the first to fourth group enable signals PBEN<1:4> being activated to a logic high level as described above.

The first and second reference signals RF<1:2> may be sequentially toggled in the interval in which the operation interval signal OPSEC maintains a logic high level. The enable control circuit 30 may exit from the second operation mode as the operation interval signal OPSEC is deactivated to a logic low level in response to the second reference signal RF2 being toggled.

All of the first to fourth group enable signals PBEN<1:4> may be simultaneously deactivated to a logic low level in response to the operation interval signal OPSEC being deactivated to a logic low level as described above. The first to fourth groups PB1*s*, PB2*s*, PB3*s*, and PB4*s* may be simultaneously disabled in response to the first to fourth group enable signals PBEN<1:4> being deactivated to a logic low level as described above.

The enable control circuit 30 may enter the second operation mode for a fourth time t4 in order to simultaneously enable the first to fourth groups PB1*s*, PB2*s*, PB3*s*, and PB4*s* when the mode selection signal SELMD has a logic low level. In this case, it may be seen that the fourth time t4 is a time shorter than the third time t3 of FIG. 11A. That is, the enable control circuit 20 may control the length of the fourth time t4 for which the enable control circuit 30 enters the second operation mode in order to simultaneously enable all of the four groups PB1*s*, PB2*s*, PB3*s*, and PB4*s* to be shorter than the length of the third time t3 for which the enable control circuit 30 enters the first operation mode in order to sequentially enable all of the four groups PB1*s*, PB2*s*, PB3*s*, and PB4*s*.

Figure 12:
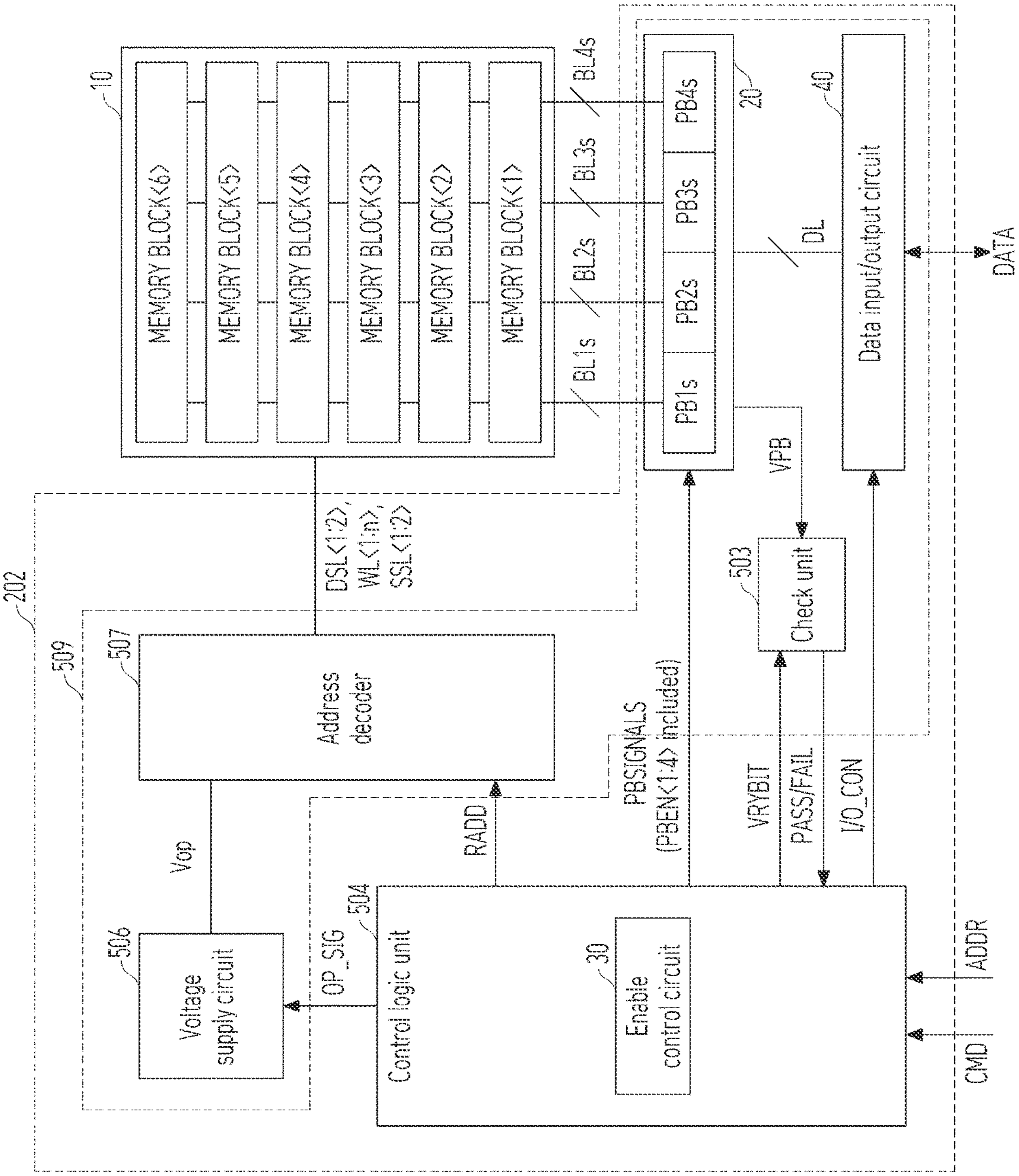
FIG. 12 is a diagram for describing a detailed construction of the memory device according to an embodiment of the present disclosure.

FIG. 12 is a diagram for describing a detailed construction of the memory device according to an embodiment of the present disclosure.

Referring to FIG. 12, the memory device according to an embodiment of the present disclosure may include the memory cell array 10 and a controller 202. The controller 202 may include a control circuit unit 509 and a control logic unit 504. Furthermore, the control circuit unit 509 may include the multiple page buffers 20, a check unit 503, the data input/output circuit 40, a voltage supply circuit 506, and an address decoder 507. Furthermore, the control logic unit 504 may include the enable control circuit 30.

The memory cell array 10 may include multiple memory blocks MEMORY BLOCK<1:6>. The multiple memory blocks MEMORY BLOCK<1:6> may be connected to the control circuit unit 509 through row lines DSL<1:2>, WL<1:n>, and SSL<1:2> and the bit lines BL1*s*, BL2*s*, BL3*s*, and BL4*s*. Each of the multiple memory blocks MEMORY BLOCK<1:6> may include multiple memory cells.

The row lines DSL<1:2>, WL<1:n>, and SSL<1:2> may include one or more source selection lines SSL<1:2>, multiple word lines WL<1:n>, and one or more drain selection lines DSL<1:2>.

The control logic unit 504 may be connected to the address decoder 507, the voltage supply circuit 506, the multiple page buffers 20, the data input/output circuit 40, and the check unit 503 that are included in the control circuit unit 509.

The control circuit unit 509 may be connected to the memory cell array 10, and may be configured to perform a program operation on a selection region of the memory cell array 10. The control circuit unit 509 may drive the memory cell array 10. For example, the control circuit unit 509 may apply various operation voltages to the row lines DSL<1:2>, WL<1:n>, and SSL<1:2> and the bit lines BL1*s*, BL2*s*, BL3*s*, and BL4*s* or may discharge a voltage that has been applied to the row lines DSL<1:2>, WL<1:n>, and SSL<1:2> and the bit lines BL1*s*, BL2*s*, BL3*s*, and BL4*s*. The control circuit unit 509 may perform a program operation on program cells in response to control of the control logic unit 504. In particular, the control circuit unit 509 may selectively enable the multiple groups PB1*s*, PB2*s*, PB3*s*, and PB4*s* that are included in the multiple page buffers 20 in response to the group enable signals PBEN<1:4> that are generated by the control logic unit 504.

The voltage supply circuit 506 of the control circuit unit 509 may be configured to generate multiple operation voltages Vop by using a power source voltage that is supplied from the outside. The voltage supply circuit 506 may operate in response to control of the control logic unit 504. In an embodiment, the voltage supply circuit 506 may generate an internal power source voltage by regulating an external power source voltage. In an embodiment, the voltage supply circuit 506 may generate the multiple operation voltages Vop by using the external power source voltage or the internal power source voltage. The voltage supply circuit 506 may include multiple pumping capacitors that receive the internal power source voltage in order to generate the multiple operation voltages Vop having various voltage levels, and may generate the multiple operation voltages Vop by selectively activating the multiple pumping capacitors in response to control of the control logic unit 504. The generated multiple operation voltages Vop may be supplied to the memory cell array 10 by the address decoder 507. For example, the voltage supply circuit 506 may adjust the level and supply time of the operation voltage Vop in response to a generation control signal OP_SIG that is generated by the control logic unit 504.

The address decoder 507 of the control circuit unit 509 may be connected to the memory cell array 10 through the row lines DSL<1:2>, WL<1:n>, SSL<1:2>, and CSL.

The address decoder 507 may be configured to operate in response to control of the control logic unit 504. The address decoder 507 may receive an address RADD from the control logic unit 504.

The address decoder 507 may be configured to decode a block address from the received address RADD. The address decoder 507 may select at least one of the memory blocks MEMORY BLOCK<1:6> based on the decoded block address. The address decoder 507 may be configured to decode a row address from the received address RADD. The address decoder 507 may select at least one of the word lines of the selected memory block based on the decoded row address. The address decoder 507 may apply, to the selected word line, the operation voltage Vop that is supplied by the voltage supply circuit 506.

Reference may be made to FIG. 1 for the description of the multiple page buffers 20 and the data input/output circuit 40 that are included in the control circuit unit 509.

After the start of a read operation or a verification operation, the check unit 503 of the control circuit unit 509 may generate a reference current in response to a detection reference signal VRYBIT that is generated by the control logic unit 504, may compare a sensing voltage VPB that is received from the multiple page buffers 20 and a reference voltage that is generated by the reference current. Further, the check unit 503 may generate a pass signal PASS or a fail signal FAIL based on a result of the comparison, and may output the pass signal PASS or the fail signal FAIL to the control logic unit 504. For example, when the voltage level of the sensing voltage VPB is greater than or equal to the reference voltage, the check unit 503 may output the pass signal PASS to the control logic unit 504. When the voltage level of the sensing voltage VPB is less than the reference voltage, the check unit 503 may output the fail signal to the control logic unit 504.

The control logic unit 504 may be connected to the address decoder 507, the voltage supply circuit 506, the multiple page buffers 20, the data input/output circuit 40, and the check unit 503 that are included in the control circuit unit 509. The control logic unit 504 may be configured to control the overall operation of the memory device. The control logic unit 504 may operate in response to a command CMD that is transferred from an external device.

The control logic unit 504 may control the control circuit unit 509 by generating various signals in response to the command CMD and an address ADDR. For example, the control logic unit 504 may generate the operation signal OP_SIG, the address RADD, the read and write circuit control signal PBSIGNALS, and the detection reference signal VRYBIT, in response to the command CMD and the address ADDR. The control logic unit 504 may output the operation signal OP_SIG to the voltage supply circuit 506, may output the address RADD to the address decoder 507, may output the read and write control signal PBSIGNALS to the page buffers 20, and may output the detection reference signal VRYBIT to the check unit 503. Furthermore, the control logic unit 504 may determine whether a verification operation has passed or failed in response to the pass signal PASS or the fail signal FAIL that is output by the check unit 503. In particular, the control logic unit 504 may include the enable control circuit 30. Accordingly, the read and write circuit control signal PBSIGNALS that is applied from the control logic unit 504 to the page buffers 20 may include the P group enable signals PBEN<1:4>. In this case, reference may be made to FIGS. 1 to 11B for the detailed construction and operation of the enable control circuit 30.

It will be evident to a person having ordinary knowledge in the art to which the present disclosure pertains that the embodiments of the present disclosure described above are not limited by the aforementioned embodiments and the accompanying drawings and that the embodiments may be substituted, modified, and changed in various ways without departing from the technical spirit of the present disclosure.

For example, the location and type of the logic gate illustrated in the aforementioned embodiments have to be differently implemented depending on the polarity of an input signal. Furthermore, the embodiments may be combined to form additional embodiments.

What is claimed is:

1. A memory device comprising:

a memory cell array including multiple memory cells;

multiple page buffers connected to the memory cells; and an enable control circuit configured to divide the page buffers into P groups of page buffers, sequentially enable L groups of page buffers among the P groups of page buffers during an entry interval of an operation mode for accessing the memory cell array, and adjust a length of the entry interval of the operation mode based on a size of data accessed by the memory cell array according to a value of L, wherein P is a natural number greater than or equal to 2, and L is a natural number greater than or equal to 1 and less than or equal to P.

2. The memory device of claim 1, wherein the enable control circuit comprises:

a signal generation unit configured to generate a selection control signal for selecting the value of L in response to a group selection signal;

a first toggling control unit configured to sequentially toggle first to L-th reference signals among P reference signals, in response to a start enable signal and the selection control signal;

a mode setting unit configured to enter the operation mode in response to the start enable signal, and configured to exit from the operation mode in response to the toggling of the L-th reference signal; and a second toggling control unit configured to select L group enable signals among P group enable signals for enabling the P groups of page buffers, respectively, in response to the group selection signal during the entry interval of the operation mode, and configured to toggle the selected L group enable signals in response to the first to L-th reference signals, respectively.

3. The memory device of claim 2, wherein the first toggling control unit comprises P flip-flops, selects an L-th flip-flop among the P flip-flops, in response to the selection control signal, and outputs L reference signals to output stages of a first flip-flop to the L-th flip-flop among the P flip-flops, respectively, in response to the start enable signal that is applied to an input stage of the first flip-flop.

4. The memory device of claim 2, wherein the mode setting unit activates an operation interval signal in response to the start enable signal, and deactivates the operation interval signal in response to the toggling of the L-th reference signal among the L reference signals that are sequentially toggled.

5. The memory device of claim 4, wherein the second toggling control unit selects the L group enable signals corresponding to the group selection signal among the P group enable signals during an activation interval of the operation interval signal, and sequentially toggles the L group enable signals in response to the L reference signals that are sequentially toggled, respectively.

6. An operating method of a memory device comprising multiple page buffers that are connected to multiple memory cells, the operating method comprising:

dividing the page buffers into P groups of page buffers;

sequentially enabling L groups of page buffers among the P groups of page buffers during an entry interval of an operation mode for accessing the multiple memory cells; and adjusting a length of the entry interval of the operation mode based on a size of data accessed by the multiple memory cells according to a value of L, wherein P is a natural number greater than or equal to 2, and L is a natural number greater than or equal to 1 and less than or equal to P.

7. The operating method of claim 6, wherein sequentially enabling the L groups of page buffers comprises:

generating a selection control signal for selecting the value of L in response to a group selection signal and P reference signals;

sequentially toggling first to L-th reference signals among the P reference signals in response to a start enable signal and the selection control signal; and selecting L group enable signals among P group enable signals for enabling the P groups of page buffers, respectively, in response to the group selection signal during the entry interval of the operation mode, and toggling the selected L group enable signals in response to the first to L-th reference signals, respectively.

8. The operating method of claim 7, wherein sequentially enabling the L groups of page buffers further comprises:

entering the operation mode in response to the start enable signal, and exiting from the operation mode in response to the toggling of the L-th reference signal.

9. The operating method of claim 8, wherein sequentially toggling first to L-th reference signals comprises:

selecting an L-th flip-flop, among P flip-flops, in response to the selection control signal, and outputting L reference signals to output stages of a first flip-flop to the L-th flip-flop among the P flip-flops, respectively, in response to the start enable signal that is applied to an input stage of the first flip-flop.

10. The operating method of claim 7, wherein adjusting the length of the entry interval of the operation mode comprises entering the operation mode by activating an operation interval signal in response to the start enable signal, and exiting from the operation mode by deactivating the operation interval signal in response to the toggling of the L-th reference signal.

11. The operating method of claim 10, wherein selecting L group enable signals comprises:

selecting the L group enable signals corresponding to the group selection signal among the P group enable signals during an activation interval of the operation interval signal, and sequentially toggling the L group enable signals in response to the L reference signals that are sequentially toggled.

* * * * *